US012658226B2

(12) United States Patent
He et al.

(10) Patent No.: US 12,658,226 B2
(45) Date of Patent: *Jun. 16, 2026

(54) PAGE BUFFERS AND OPERATION METHODS THEREOF, MEMORY DEVICES, AND MEMORY SYSTEMS

(71) Applicant: Yangtze Memory Technologies Co., Ltd., Wuhan (CN)

(72) Inventors: Weiwei He, Wuhan (CN); Ke Liang, Wuhan (CN); Wei Huang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 103 days.

This patent is subject to a terminal disclaimer.

(21) Appl. No.: 18/614,221

(22) Filed: Mar. 22, 2024

(65) Prior Publication Data

US 2025/0174255 A1 May 29, 2025

(30) Foreign Application Priority Data

Nov. 27, 2023 (CN) .......................... 202311607431.X

(51) Int. Cl.
*G11C 7/10* (2006.01)
*G11C 7/12* (2006.01)
*G11C 7/20* (2006.01)

(52) U.S. Cl.
CPC .............. *G11C 7/1087* (2013.01); *G11C 7/12* (2013.01); *G11C 7/20* (2013.01)

(58) Field of Classification Search
CPC ..................................................... G11C 7/1087
See application file for complete search history.

(56) References Cited

U.S. PATENT DOCUMENTS

| | | | |
|---|---|---|---|
| 2016/0240232 A1* | 8/2016 | Lee ......................... | G11C 29/42 |
| 2019/0244641 A1* | 8/2019 | Jamali .................. | G11C 11/2273 |
| 2020/0243149 A1* | 7/2020 | Hsu ......................... | G11C 16/26 |
| 2023/0057357 A1* | 2/2023 | Lin ......................... | G11C 7/065 |
| 2023/0290420 A1* | 9/2023 | Choi .................. | G11C 16/0483 |

* cited by examiner

*Primary Examiner* — Hoai V Ho
(74) *Attorney, Agent, or Firm* — Hanley, Flight & Zimmerman, LLC

(57) ABSTRACT

Examples of the present application disclose a page buffer including a plurality of latch circuits. Each latch circuit includes a resetting control circuit, a setting control circuit, a data transmission circuit, and a latch transmission circuit. The resetting control circuit is coupled to a first data node and configured to receive a first supply voltage, so as to determine a potential of the first data node. The setting control circuit is coupled to a second data node and configured to receive the first supply voltage, so as to determine a potential of the second data node. The data transmission circuit is coupled to the first data node and the second data node and configured to receive a second supply voltage. The latch transmission circuit is coupled to the first data node, the second data node, and a sense node. The first supply voltage is higher than the second supply voltage.

20 Claims, 11 Drawing Sheets

6223

60

61

611

62

Peripheral circuit

60

62

624

627

625

623

61

Voltage generator

Control logic unit

Row decoder/bit line driver

Memory cell array

I/F

Latch circuit

626

621

620

Page buffer/sense amplifier

Column decoder/word line driver

628

PAGE BUFFERS AND OPERATION METHODS THEREOF, MEMORY DEVICES, AND MEMORY SYSTEMS

CROSS REFERENCE TO RELATED APPLICATION

This application claims priority to and the benefit of Chinese Patent Application 202311607431.X, filed on Nov. 27, 2023, which is hereby incorporated by reference in its entirety.

TECHNICAL FIELD

Examples of the present disclosure relate to semiconductor technology, and relate to but not limited to page buffers and operation methods thereof, memory devices, and memory systems.

BACKGROUND

Semiconductor memories may be roughly divided into two categories, depending on whether they retain stored data in the case of loss of power. Such two categories of semiconductor memories are: volatile memories and non-volatile memories. The volatile memories lose the stored data in the case of the loss of power, and the non-volatile memories retain the stored data in the case of loss of power. Memory cells in the non-volatile memories are connected to bit lines and word lines respectively, and thus have good random access time characteristics.

BRIEF DESCRIPTION OF THE DRAWINGS

In the drawings, like reference numerals may describe like components in different views. Like reference numerals having different letter suffixes may represent different examples of like components. The accompanying drawings illustrate generally, by way of example, but not by way of limitation, various examples as discussed herein.

DETAILED DESCRIPTION

Figure 1:
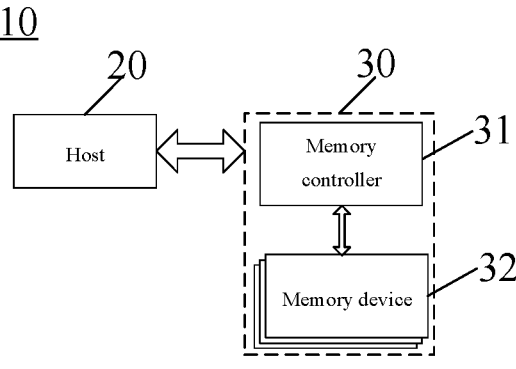
FIG. 1 is a schematic structural diagram of an electronic system provided by an example of the present application.

In order to facilitate the understanding of the present application, the present application will be described below more comprehensively with reference to the relevant drawings. Preferable examples of the present application are given in the drawings. However, the present application may be implemented in many different forms, and is not limited to the examples described herein. Instead, the purpose of providing these examples is to make the disclosure of the present application more thorough and comprehensive.

Unless otherwise defined, all technical and scientific terms used herein have the same meanings as those generally understood by those skilled in the technical field of the present application. The terms used in the specification of the present application are only for the purpose of describing examples, and are not intended to limit the present application. The term "and/or" used herein include any and all combinations of one or more listed associated items.

The terms "first", "second" and the like used in the present application do not indicate any order, quantity, or significance, but are used only to distinguish different constituent parts. Similarly, the term such as "one", "a" or "the" does not indicate a quantitative limitation, but refers to "at least one". The term such as "including" or "containing" means that a component or object appearing in front of the term covers a component or object listed following the term and its equivalents, without excluding other components or objects. The term such as "connecting", "connected" or "coupling" is not defined as physical or mechanical coupling, but may include electrical coupling, whether direct or indirect.

In order to understand the present application thoroughly, detailed operations and detailed structures will be proposed in the following description to set forth the technical solution of the present application. The detailed descriptions of the preferable examples of the present application are as follows. However, the present application may also have other implementations in addition to these detailed descriptions.

With the increase of an integration level of the memory, an area occupied by a page buffer in a peripheral circuit of the memory device is limited and tends to decrease as required, and thus a reduction in the number of elements constituting the page buffer is also required.

As shown in FIG. 1, examples of the present application illustrate an electronic system 10. In an example, the electronic system 10 may include, but is not limited to, a mobile phone, a desktop computer, a laptop computer, a tablet computer, a vehicle computer, a game console, a printer, a positioning apparatus, a wearable electronic apparatus, a smart sensor, a Virtual Reality (VR) apparatus, an Augmented Reality (AR) apparatus or any other suitable electronic apparatuses having memory devices 32 therein.

With continued reference to FIG. 1, the electronic system 10 may comprise a host 20 and a memory system 30.

The host 20 may be a processor (for example, a Central Processing Unit (CPU), or a System on a Chip (SoC) (e.g., an Application Processor (AP)) of an electronic apparatus. The host 20 may be configured to send or receive data to or from the memory system 30.

The memory system 30 comprises a memory controller 31 and one or more memory devices 32, as well as other integrated circuit structures used for signal transmission. The memory controller 31 and the one or more memory devices 32 may be integrated and packaged in the same memory apparatus. As such, it is favorable to the application of the memory system 30 in different types of end electronic products.

In an example, types of the memory apparatus that integrates the memory controller 31 and the one or more memory devices 32 include: Universal Flash Storage (UFS) or Embedded Multi Media Card (eMMC), among other types of memory apparatuses.

Figure 2:
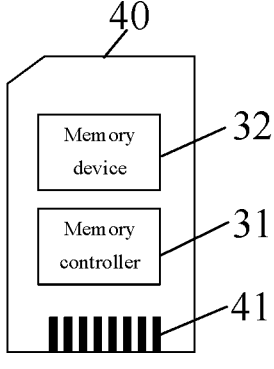
FIG. 2 is a schematic structural diagram of a memory card provided by an example of the present application.
Figure 3:
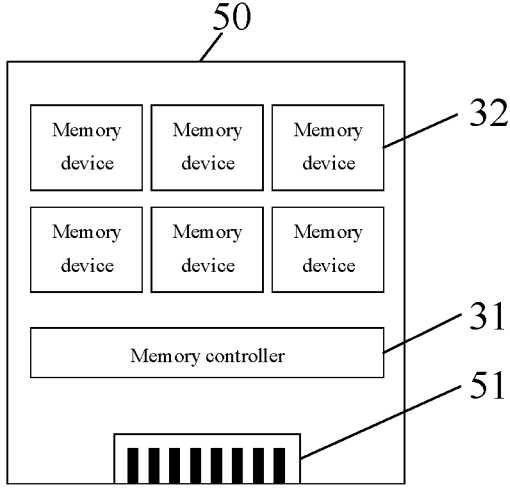
FIG. 3 is a schematic structural diagram of a solid state disk (SSD) provided by an example of the present application.

There are various patterns of integrated circuits of the memory apparatus, e.g., a memory card 40 (as shown in FIG. 2) formed by integrating a single memory device 32 and the memory controller 31 together, or an SSD 50 (as shown in FIG. 3) formed by integrating a plurality of memory devices 32 and the memory controller 31 together.

In an example, the memory card 40 may include one or more types of memory apparatuses among a Personal Computer Memory Card International Association (PC) card, a CF card, a Smart Media (SM) card, a memory stick, a Multi-Media Card (MMC, Reduced-Size MMC (RS-MMC), and MMCmicro), an SD card (SD, miniSD, microSD, Secure Digital High Capacity (SDHC)), and a UFS, etc.

With continued reference to FIG. 2, the memory card 40 further comprises a memory card connector 41. The memory card connector 41 is configured to couple the memory card 40 with a host (e.g., the host 20 in FIG. 1). For example, the memory card connector 41 includes a golden finger.

Alternatively, with continued reference to FIG. 3, the SSD 50 further comprises an SSD connector 51. The SSD connector 51 is configured to couple the SSD 50 with a host (e.g., the host 20 in FIG. 1). For example, the SSD connector 51 includes a golden finger.

It may be understood that a storage capacity and/or operation speed of the SSD 50 are greater than a storage capacity and/or operation speed of the memory card 40.

The memory controller 31 integrated in the same memory apparatus is coupled with the memory device 32 (and the host 20), and the memory controller 31 is configured to control the memory device 32.

In an example, the memory controller 31 may be designed to operate in a low duty-cycle environment. For example, the memory controller is configured to operate in a Secure Digital (SD) card, a Compact Flash (CF) card, a Universal Serial Bus (USB) flash drive, or other media for use in electronic apparatuses, such as a personal computer, a digital camera, and a mobile phone, etc. In another example, the memory controller 31 may be designed to operate in a high duty-cycle environment, such as an SSD or an embedded Multi-Media Card (eMMC). The SSD or eMMC may be used as a data storage for mobile apparatuses, such as a smartphone, a tablet computer, and a laptop computer, etc., and an enterprise memory array.

Further, the memory controller 31 can manage data in the memory device 32 and communicate with the host 20. The memory controller 31 may be configured to control read, erase and program operations of the memory device 32, may be further configured to manage various functions with respect to data stored or to be stored in the memory device 32, including, but not limited to, bad-block management, garbage collection, logical-to-physical address translation, and wear leveling, etc., and may be further configured to process Error Checking and Correction (ECC) code with respect to data read from or written to the memory device 32.

Furthermore, the memory controller 31 may further perform any other suitable functions, e.g., formatting the memory device 32 or communicating with an external apparatus (e.g., the host 20 in FIG. 1) according to an example communication protocol. For example, the memory controller 31 may communicate with the host 20 through at least one of various interface protocols. The interface protocols include one or more of a USB protocol, an MMC protocol, a Peripheral Component Interconnect (PCI) protocol, a Peripheral Component Interconnect Express (PCI-E) protocol, an Advanced Technology Attachment (ATA) protocol, a serial ATA protocol, a parallel ATA protocol, a Small Computer System Interface (SCSI) protocol, an Enhanced Small Disk Interface (ESDI) protocol, an Integrated Drive Electronics (IDE) protocol, and a Firewire protocol, etc.

The above memory device 32 may include, but is not limited to, one or more of a NAND Flash Memory, a Vertical NAND Flash Memory, a NOR Flash Memory, a Dynamic Random Access Memory (DRAM), a Ferroelectric Random Access Memory (FRAM), a Magnetoresistive Random Access Memory (MRAM), a Phase Change Random Access Memory (PCRAM), a Resistive Random Access Memory (RRAM), a Nano Random Access Memory (NRAM), etc.

Based on the above description, the present application uses the memory device 32 being a semiconductor memory, e.g., a solid state electronic device (such as a NAND memory) fabricated using a semiconductor integrated circuit process for storing data information, as an example for subsequent description of the implementations. The subsequent examples of the present application do not limit an interior structure of the memory device 32.

It may be understood that, in order to facilitate distinguishing between cases of adaptive adjustments made to the memory device 32 for applications to different scenarios, e.g., various example structures of the memory device 32 based on the above content, the memory device (e.g., NAND memory) provided in the subsequent examples of the present application is illustrated using a memory device 60.

Figure 4:
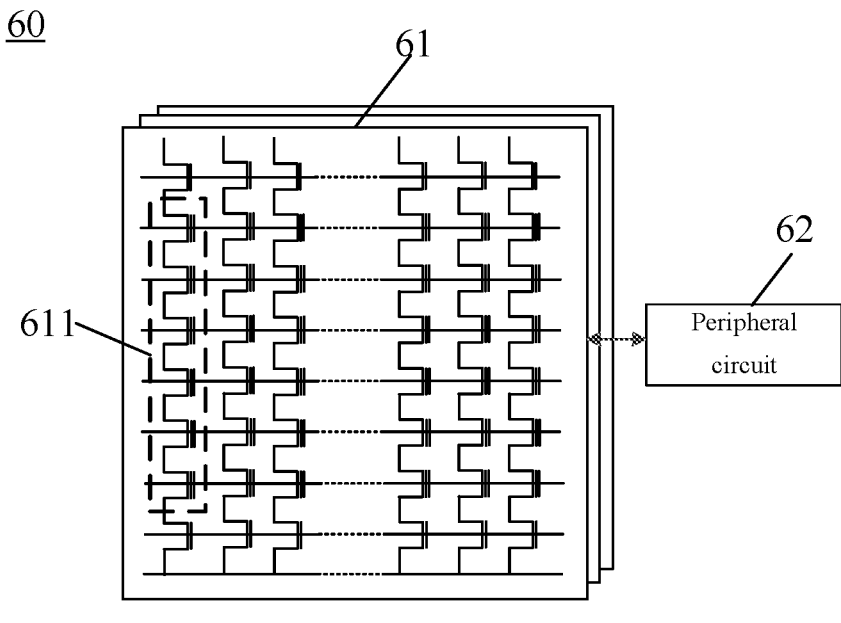
FIG. 4 and FIG. 5 are schematic structural diagrams of a memory comprising a memory cell array and a peripheral circuit provided by an example of the present application.

As shown in FIG. 4, in some examples, the memory device 60 may comprise a memory cell array 61 and a circuit structure such as a peripheral circuit 62 coupled to the memory cell array 61, etc.

The memory cell array 61 is coupled with the plurality of bit lines (BLs). In an example, the memory cell array 61 may be a NAND flash memory cell array. For example, the memory cell array 61 is a circuit structure disposed in the form of an array arrangement of NAND memory strings 611. Each NAND memory string 611 extends vertically on a substrate. In an example, each NAND memory string 611 may comprise a plurality of memory cells that are coupled in series and stacked vertically. Each memory cell performs signal transmission in a state of holding a continuous analog value (such as a voltage or charge), and the analog value of the memory cell depends on a number of electrons trapped within a region of the memory cell.

In an example, each memory cell in the memory cell array 61 may be either a floating gate memory cell that includes a floating gate transistor, or a charge trap memory cell that includes a charge trap transistor. The present application does not impose limitations thereto.

In some examples, memory types of the above memory cells include any one of a Single Level Cell (SLC), a Multi Level Cell (MLC), a Triple Level Cell (TLC), and a Quad Level Cell (QLC), etc.

In an example, each SLC memory cell can store one bit of data and has two possible memory states: a first memory state and a second memory state. The first memory state (e.g., "0") corresponds to a first threshold voltage range, and the second memory state (e.g., "1") corresponds to a second threshold voltage range. As such, the second memory state (e.g., "1") serves as an erased state, and the first memory state (e.g., "0") serves as a programmed state.

In another example, each MLC memory cell can store two bits of data and has four possible memory states: a first memory state, a second memory state, a third memory state, and a fourth memory state. The first memory state (e.g., "11") corresponds to a first threshold voltage range, the second memory state (e.g., "01") corresponds to a second threshold voltage range, the third memory state (e.g., "10") corresponds to a third threshold voltage range, and the fourth memory state (e.g., "00") corresponds to a fourth threshold voltage range. As such, the fourth memory state (e.g., "00") serves as an erased state, the first memory state (e.g., "11"), the second memory state (e.g., "01"), and the third memory state (e.g., "10") serve as programmed states.

Similarly, each TLC memory cell can store three bits of data and has eight possible memory states. The eight memory states correspond to eight threshold voltage ranges respectively, and the memory states are no longer repeated here. One of the eight threshold voltage ranges serves as an erased state (e.g., "111"), and the other seven threshold voltage ranges serve as programmed states. Furthermore, each QLC memory cell can store four bits of data and has sixteen possible memory states. The sixteen memory states correspond to sixteen threshold voltage ranges respectively, and the memory states are no longer repeated here. One of the sixteen threshold voltage ranges serves as an erased state (e.g., "1111"), and the other fifteen threshold voltage ranges serve as programmed states.

With continued reference to FIG. 4, the above peripheral circuit 62 may be coupled to the memory cell array 61 via a Bit Line (BL), a Word Line (WL), a Source Line (SL), a Source Select Gate (SSG), and a Drain Select Gate (DSG). The peripheral circuit 62 is configured to implement a logic operation (e.g., a program, read, or write operation) on the memory cell array 61 by applying voltage signals and/or current signals to each target memory cell and sensing voltage signals and/or current signals from each target memory cell via the bit line BL, the word line WL, the source line SL, the source select gate SSG, or the drain select gate DSG, etc.

Figure 5:
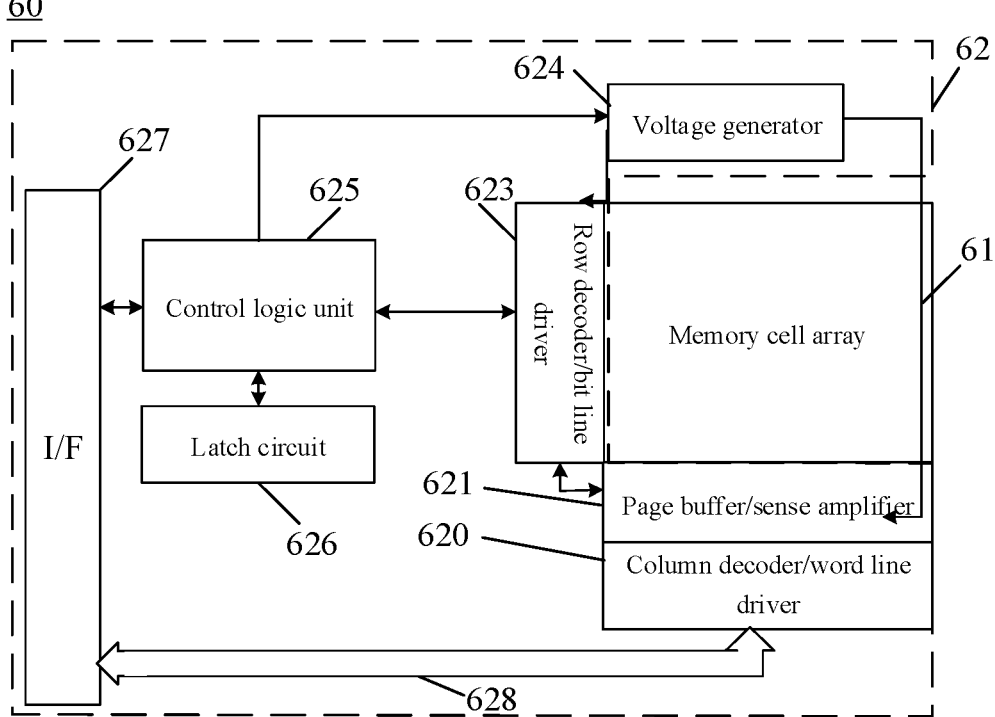

In an example, the peripheral circuit 62 comprises various types of circuit structures formed using Metal-Oxide-Semiconductor (MOS) transistors. For example, as shown in FIG. 5, the peripheral circuit 62 may comprise various circuit structures such as a row decoder/word line driver 620, a page buffer (PB)/sense amplifier 621, a column decoder/bit line driver 623, a voltage generator 624, a control logic unit 625, a latch circuit 626, an interface 627, and a data bus 628, etc.

Figure 6:
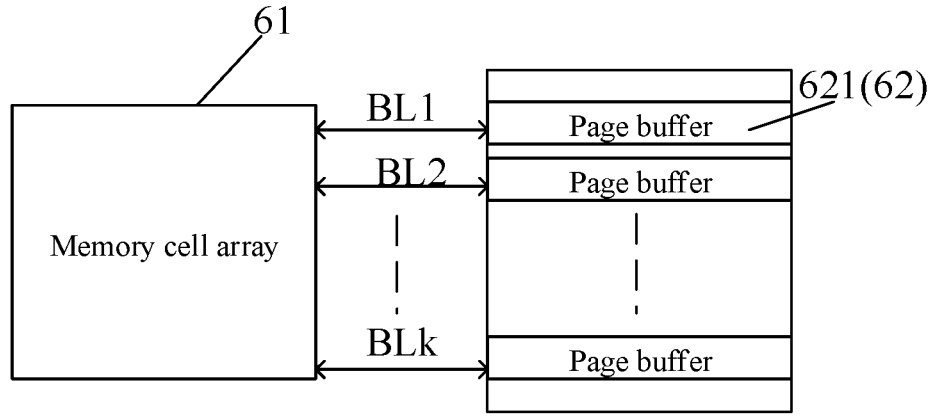
FIG. 6 is a schematic structural diagram of a memory comprising a page buffer group provided by an example of the present application.

Further, as shown in FIG. 6, the peripheral circuit 62 may comprise a page buffer group consisting of a plurality of page buffers 621. The page buffer group may be coupled with the memory cell array 61 via a plurality of bit lines (BL1 to BLk). One page buffer 621 is coupled with the memory cell array 61 via one bit line. For example, as shown in FIG. 6, the plurality of page buffers 621 may be coupled with the memory cell array 61 via the respective bit lines BL1 to BLk, respectively.

Figure 7:
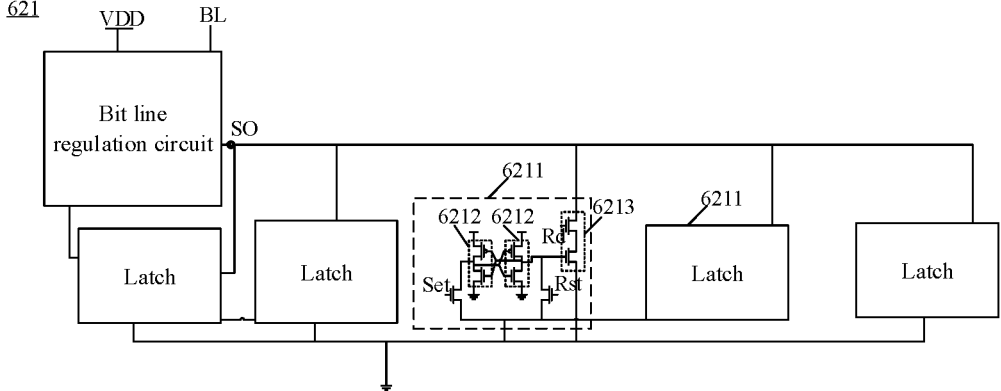
FIG. 7 is a schematic diagram of a page buffer provided by an example implementation.

Based on the above content, in some examples, the page buffer 621 of the peripheral circuit 62 comprises a plurality of latches 6211. In an example, as shown in FIG. 7, the page buffer 621 of the peripheral circuit 62 comprises at least five latches 6211.

A latch 6211 comprises two phase inverters 6212 connected end-to-end, a data transmission circuit 6213, and other electronic elements. The two phase inverters 6212 comprise at least four transistors. In such case where the page buffer 621 comprises a plurality of latches 6211, especially for TLC and QLC memory cells, the page buffer 621 is required to be provided with more latches 6211 to realize data read or program, and thus there are more transistors in each page buffer 621. Accordingly, in the case where the peripheral circuit 62 implements the logic (e.g., program, read, or write) operation through the page buffer group (see FIG. 6), the number of the electronic elements of the plurality of page buffers 621 are accumulated, resulting in a sudden increase of a space occupied by the peripheral circuit 62 in the memory device 60 (e.g., occupying nearly ⅓ of an interior space of the memory device 60), thereby reducing an energy efficiency ratio of the memory device 60.

In order to solve the above problem, as shown in FIG. 8 to FIG. 20, the present application provides a structure of the page buffer 622, so as to simplify the circuit structure and reduce a space in the memory device 60 occupied by and fabrication costs of the page buffer 622.

Figure 8:
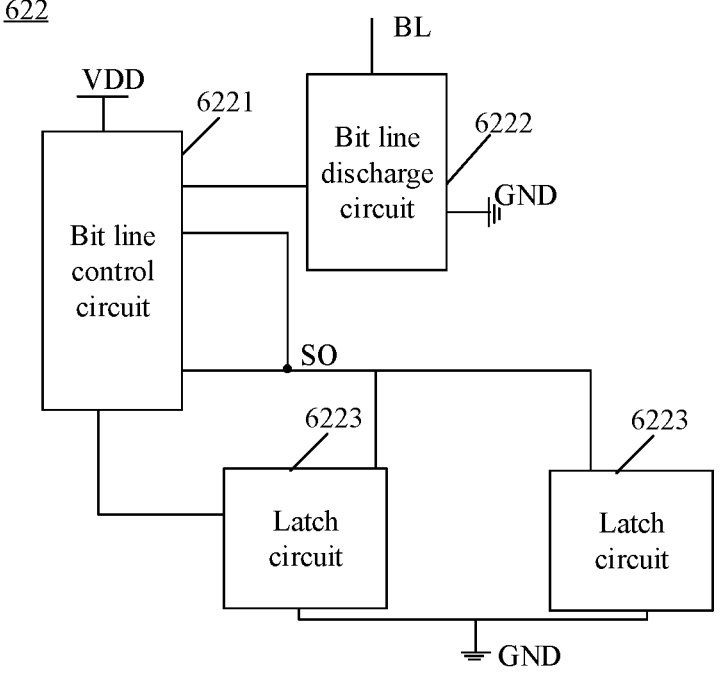
FIG. 8 is a schematic diagram I of a page buffer provided by the examples of the present application.

In some examples, as shown in FIG. 8, the page buffer 622 comprises a bit line control circuit 6221, a bit line discharge circuit 6222, and a plurality of latch circuits 6223.

The bit line control circuit 6221 is coupled with a first supply voltage node N1, the bit line BL, and a sense node SO, and is configured to control a potential level of the sense node SO during a sense operation based on a current level of the bit line BL. For example, whether to charge the bit line may be determined according to a program verify result latched in the latch circuits 6223. For example, when the program verify result indicates that a memory cell reaches a target threshold voltage, the bit line BL coupled to the memory cell may be charged to a program inhibit bit line voltage (e.g., VDD) through the bit line control circuit 6221, so as to inhibit program; and when the program verify result indicates that the memory cell does not reach the target threshold voltage, the bit line BL coupled to the memory cell may be regulated to a normal program bit line voltage (e.g., VSS) or a bit line BL force voltage (greater than VSS and less than VDD) through the bit line control circuit 6221, so as to continue the programming.

The bit line discharge circuit 6222 is coupled between the bit line BL and a second supply voltage node N2 and is configured to discharge a potential level of the bit line BL in response to a discharge control signal (e.g., VDD).

It may be understood that a level of the first supply voltage node N1 is VDD, and a level of the second supply voltage node N2 is VSS. An identifier of a "node" adopted in an example of the present application only characterizes a transmission signal level feature of the node in an example, but does not limit a magnitude of an actual level signal transmitted by the node.

Figure 9:
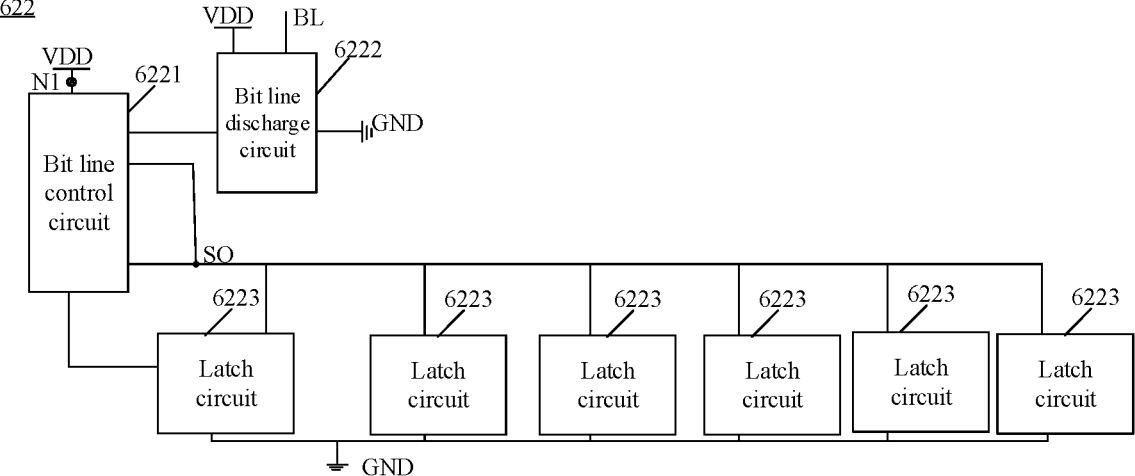
FIG. 9 is a schematic diagram II of a page buffer provided by the examples of the present application.

The plurality of latch circuits 6223 are all coupled with the sense node SO, and charge and discharge the level of the sense node SO under driving of the bit line control circuit 6221 and the bit line discharge circuit 6222. For example, there are six latch circuits 6223 in the page buffer 622 as shown in FIG. 9. The six latch circuits 6223 may comprise a Sense Latch (S Latch), a Low Voltage Latch (LVT Latch), three Data Latches (D Latch), and a Cache Latch (C Latch).

The sense latch S Latch may be configured to store inhibition information and verification information from a verify operation.

The cache latch C Latch is configured to perform data exchange with the outside, for example, external data is first transmitted to the cache latch C Latch, and then transmitted to the sense latch S Latch through the cache latch C Latch. For another example, the data in the sense latch S Latch is transmitted to the cache latch C Latch, and then transmitted to the outside through the cache latch C Latch. The outside may be the memory controller 31 or the host 20, etc. For still another example, the cache latch C Latch may also be used for other functions, e.g., for temporarily storing the verification information.

The data latch D Latch may be configured to latch data of a designated page of the memory cell.

The low voltage latch LVT Latch may be configured to store the inhibition information and adjusted verification information from a verify operation.

In some examples, memory cell-based memory types include memory types such as an SLC, an MLC, a TLC, and a QLC.

If the memory cell is an SLC, the latch circuits 6223 in the page buffer 622 may include the cache latch. The cache latch is configured to latch data of the memory cell.

If the memory cell is an MLC, in addition to the cache latch C Latch, the page buffer 622 may further comprise one data latch D Latch. The data latch D Latch may be configured to latch data of a lower page of the memory cell, and the cache latch C Latch may be configured to latch data of an upper page of the memory cell.

If the memory cell is a TLC, in addition to the cache latch C Latch, the page buffer 622 may further comprise two data latches D Latch. One data latch D Latch may be configured to latch the data of the lower page of the memory cell, the other data latch D Latch may be configured to latch data of a middle page of the memory cell, and the cache latch C Latch may be configured to latch the data of the upper page of the memory cell.

By analogy, if the memory cell is an nLC, the number of data latches D Latch in the page buffer 622 may be n–1, wherein the n–1 data latches D Latch respectively latch data of designated pages of the memory cell, and n is a positive integer greater than 0.

It may be understood that the sense latch S Latch, the low voltage latch LVT Latch, the data latch D Latch, and the cache latch C Latch contain subcircuits of partially identical structures, and the subcircuits of the partially identical structures can implement complete data transmission. The sense latch S Latch and the cache latch C Latch further comprise additional electronic elements to assist in the implementation of the data transmission, and the present application imposes no limitations on structures of the additional electronic elements. In subsequent examples, the partially identical circuit structures of different types of latch circuits 6223 are illustrated, and thus the reference to the latch circuits 6223 in the subsequent examples does not limit the types of the latch circuits 6223.

Figure 10:
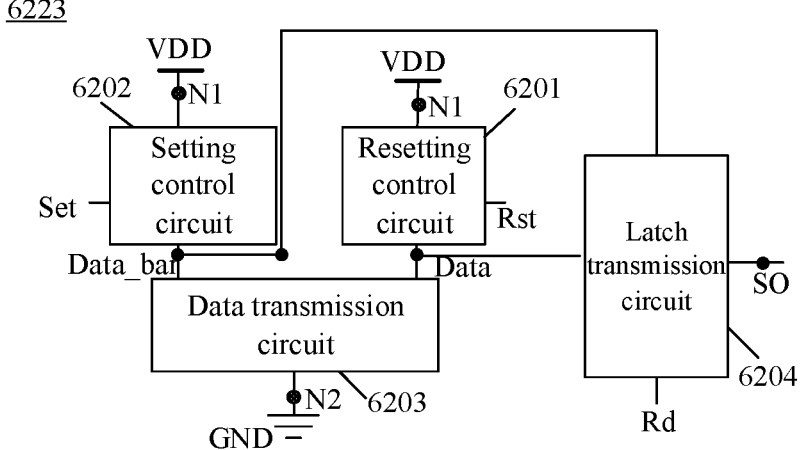
FIG. 10 is a schematic diagram of a of a latch circuit of the page buffer provided by the examples of the present application.

In some examples, as shown in FIG. 10, each latch circuit 6223 comprises a resetting control circuit 6201, a setting control circuit 6202, a data transmission circuit 6203, and a latch transmission circuit 6204.

The resetting control circuit 6201 is coupled to a first data node Data and is configured to receive a first supply voltage V1, so as to determine a potential of the first data node Data.

The setting control circuit 6202 is coupled to a second data node Data_bar and is configured to receive the first supply voltage V1, so as to determine a potential of the second data node Data_bar.

The data transmission circuit 6203 is coupled to the first data node Data and the second data node Data_bar and is configured to receive a second supply voltage V2.

The latch transmission circuit 6204 is coupled to the first data node Data, the second data node Data_bar, and the sense node SO.

The first supply voltage V1 is higher than the second supply voltage V2. In an example, a level of the first supply voltage V1 is VDD, a level of the second supply voltage V2 is VSS, and VDD is greater than VSS.

By coupling the latch transmission circuit 6204 in the page buffer 622 with the first data node Data and the second data node Data_bar, the present application controls the latch transmission circuit 6204 to be connected with or disconnected from the sense node SO based only on logic levels of the first data node Data and the second data node Data_bar.

As such, in the case where the latch transmission circuit 6204 need not be coupled with the second supply voltage node N2 (as shown in FIG. 7, the phase inverters 6212 and the data transmission circuit 6213 are grounded), the latch transmission circuit is controlled to be connected with or disconnected from the sense node based on the logic levels of the first data node Data and the second data node Data_bar that are obtained under a joint action of the data transmission circuit 6203, the setting control circuit 6202, and the resetting control circuit 6201, thus reducing grounding line structures. Moreover, the number of electronic elements (e.g., transistors) is also reduced due to not using the phase inverters 6212, thereby reducing the fabrication costs of and the space in the memory device 60 occupied by the page buffer 622. In the case where the memory device 60 comprises a page buffer group or comprises page buffers 622 for driving a multi level cell type, the fabrication costs of and the space occupied by the page buffer 622 can be reduced significantly.

Moreover, due to the simplified circuit structure, the complexity of a signal transmission path between the page buffer 622 and the sense node SO is reduced, a loss during transmission of the level signal is reduced, and thus the overall performance of the memory device 60 is improved.

Furthermore, under the condition that an area occupied by the page buffer 622 is unchanged, more latch circuits 6223 may be disposed (e.g., data latch circuits 6223 are added), so as to meet demands of the memory device 60 of more bits of data, such that more bits of data information may be stored, which is favorable to increase a bit density of the memory device 60.

In some examples, the setting control circuit 6202 is configured to set the second data node Data_bar and the first data node Data to a first logic level and a second logic level respectively in response to a setting signal set being in an enabled state. The first logic level is higher than the second logic level.

In an example, the first logic level is a high level, and the second logic level is a low level. It may be understood that the "high level" and "low level" are two signal levels indicative of relative magnitudes of level signals. For example, the first logic level is VDD, the second logic level is VSS, and VDD is greater than VSS. As such, the level of the second data node Data_bar is VDD, and the level of the first data node Data is VSS.

The resetting control circuit 6201 is configured to set the first data node Data and the second data node Data_bar to the first logic level and the second logic level respectively in response to a reset signal rst being in an enabled state. For example, the level of the second data node Data_bar is VSS, and the level of the first data node Data is VDD.

The latch transmission circuit 6204 is configured to couple the second data node Data_bar with the sense node SO in response to a transmission signal rd being in an enabled state and the first data node Data and the second data node Data_bar being at the first logic level and the second logic level respectively, wherein the sense node SO is at the second logic level (e.g., VSS).

Figure 15:
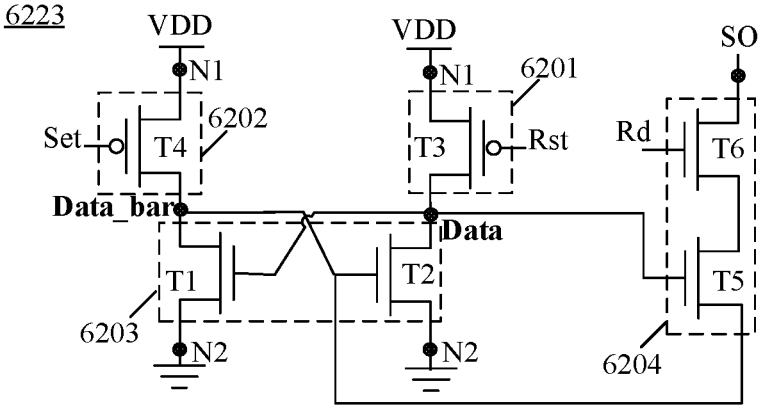
FIG. 15 is a schematic diagram of a logic circuit of the latch circuit of the page buffer provided by the examples of the present application.
Figure 19:
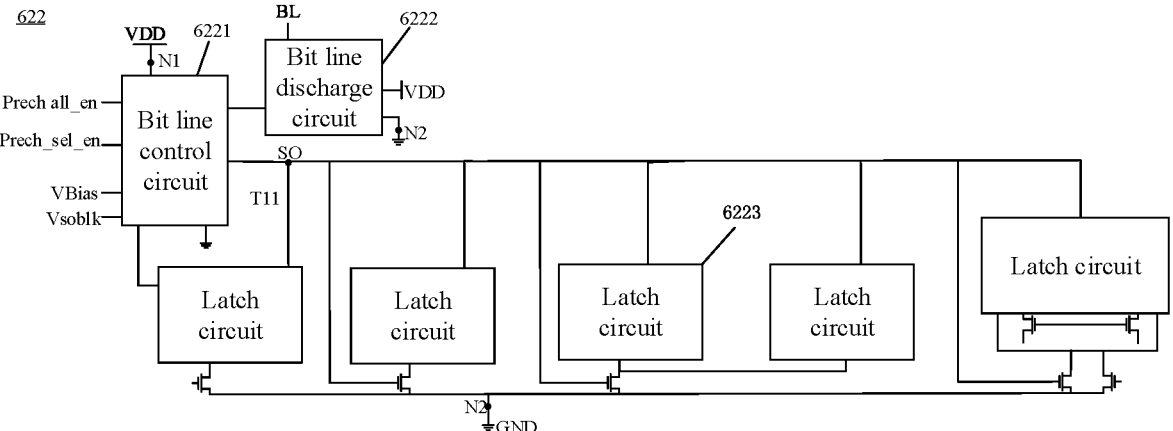
FIG. 19 is a schematic diagram of logic circuits of a bit line control circuit and a bit line discharge circuit of the page buffer provided by the examples of the present application.

The above transmission signal rd is a signal transmitted by an Rd end (referring to FIG. 10). For ease of understanding, an identity of a signal end provided in the example of the present application is distinguished from an identifier of a signal transmitted by the signal end through capitalization of the first letter. It is similar for identities of signals such as the setting signal set, the reset signal rst, a prech_sel_en signal, a prech_all_en signal, and a data setting signal rst_sa_latch mentioned in subsequent examples (corresponding to various signal ends as shown in FIG. 15 and FIG. 19).

In some examples, the latch transmission circuit 6204 is further configured to, when the sense node SO is at the first logic level, maintain the sense node SO at the first logic level in response to the transmission signal rd being in the enabled state and the first data node Data and the second data node Data_bar being at the second logic level and the first logic level respectively.

In an example, the sense node SO is at the first logic level. When the level of the second data node Data_bar is VDD and the level of the first data node Data is VSS, the latch transmission circuit 6204 disconnects the second data node Data_bar from the sense node SO, so that the sense node SO is maintained at the first logic level.

10

Figure 11:
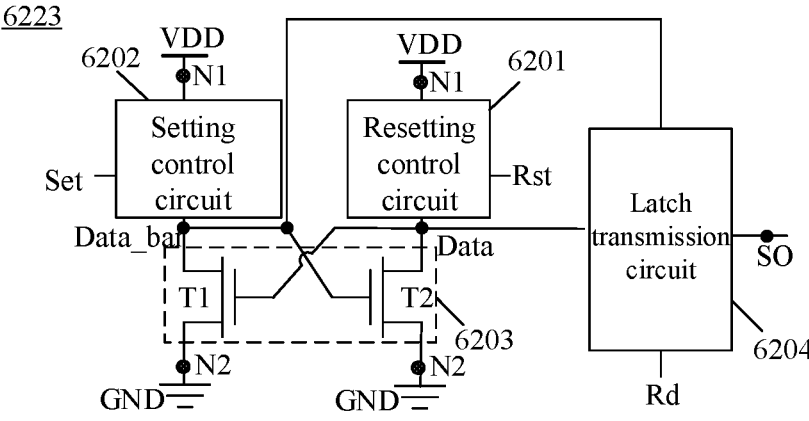
FIG. 11 is a schematic diagram I of a partial logic circuit of the latch circuit of the page buffer provided by the examples of the present application.

In some examples, as shown in FIG. 11, the data transmission circuit 6203 comprises a first transistor T1 and a second transistor T2.

A control electrode of the first transistor T1 is coupled with the first data node Data, a first electrode of the first transistor T1 is coupled with the second supply voltage node N2, and a second electrode of the first transistor T1 is coupled with the second data node Data_bar. A control electrode of the second transistor T2 is coupled with the second data node Data_bar, a first electrode of the second transistor T2 is coupled with the second supply voltage node N2, and a second electrode of the second transistor T2 is coupled with the first data node Data.

In an example, with continued reference to FIG. 11, the first transistor T1 and the second transistor T2 are N-type transistors.

Figure 12:
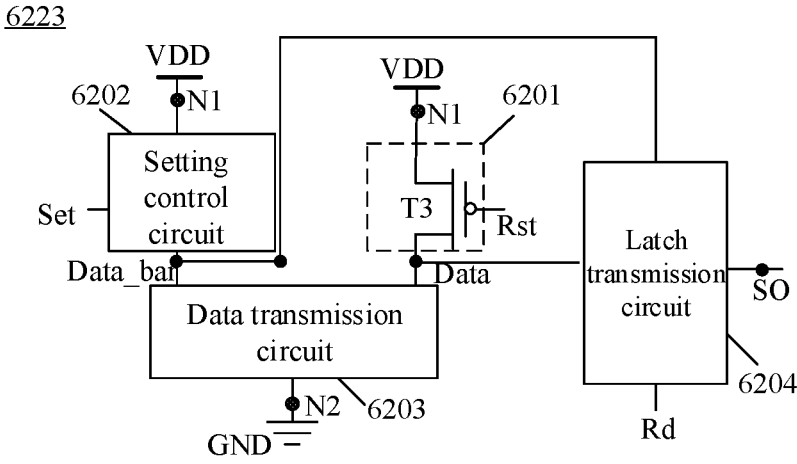
FIG. 12 is a schematic diagram II of the partial logic circuit of the latch circuit of the page buffer provided by the examples of the present application.

In some examples, as shown in FIG. 12, the resetting control circuit 6201 comprises a third transistor T3. A control electrode of the third transistor T3 receives the reset signal rst, a first electrode of the third transistor T3 is coupled with the first supply voltage node N1, and a second electrode of the third transistor T3 is coupled with the first data node Data.

In an example, as shown in FIG. 12, the third transistor T3 is a P-type transistor.

Figure 13:
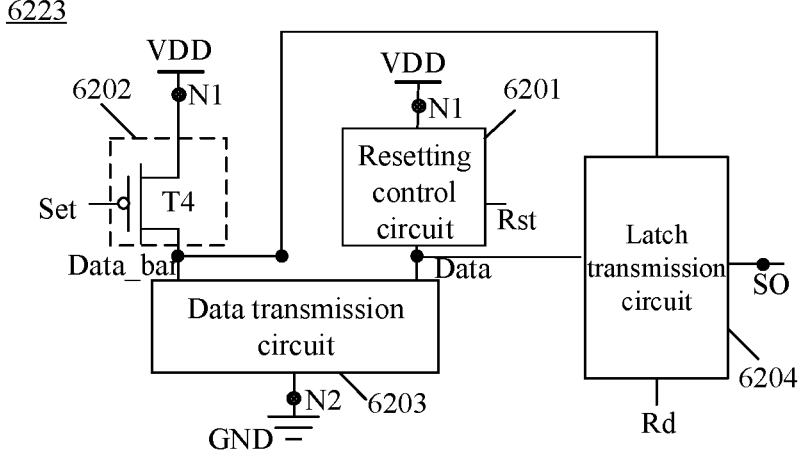
FIG. 13 is a schematic diagram III of the partial logic circuit of the latch circuit of the page buffer provided by the examples of the present application.

In some examples, as shown in FIG. 13, the setting control circuit 6202 comprises a fourth transistor T4. A control electrode of the fourth transistor T4 receives the setting signal set, a first electrode of the fourth transistor T4 is coupled with the first supply voltage node N1, and a second electrode of the fourth transistor T4 is coupled with the second data node Data_bar.

In an example, as shown in FIG. 13, the fourth transistor T4 is a P-type transistor.

Figure 14:
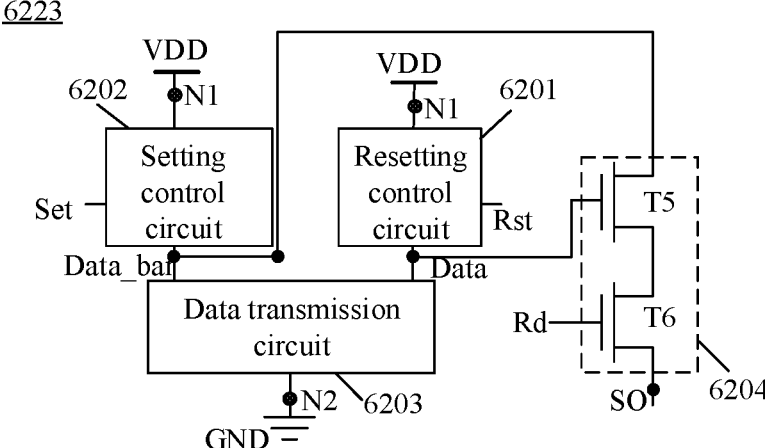
FIG. 14 is a schematic diagram IV of the partial logic circuit of the latch circuit of the page buffer provided by the examples of the present application.

In some examples, as shown in FIG. 14, the latch transmission circuit 6204 comprises a fifth transistor T5 and a sixth transistor T6 in a serial cascade relationship.

A control electrode of the fifth transistor T5 is coupled with the first data node Data, a first electrode of the fifth transistor T5 data is coupled with the second data node Data_bar, and a second electrode of the fifth transistor T5 is coupled with a first electrode of the sixth transistor T6. A control electrode of the sixth transistor T6 receives the transmission signal rd, and a second electrode of the sixth transistor T6 is coupled with the sense node SO.

In an example, with continued reference to FIG. 14, the fifth transistor T5 and the sixth transistor T6 are N-type transistors. Considering that a leakage current of an N-type transistor is small, the latch transmission circuit 6204 using an electronic element having an N-type transistor can reduce the risk of a sensitive level change of the sense node SO caused by the leakage current, thus improving data accuracy of the sense latch circuit 6223.

It may be understood that when the fifth transistor T5 and the sixth transistor T6 are N-type transistors, the effect on actual level magnitudes of the first data node Data and the second data node Data_bar is determined in conjunction with a process of transmitting a level signal of an entire circuit structure of the latch circuit 6223 in the resetting control circuit 6201 and the setting control circuit 6202. For example, as shown in FIG. 12, the third transistor T3 is a P-type transistor. The P-type transistor is turned on under control of a low level (i.e., a control electrode of the P-type transistor is more sensitive to a magnitude of the sensed level signal), and can transfer charges of the first supply node N1 to the first data node Data as much as possible. Similarly, as shown in FIG. 13, the fourth transistor T4 is set to a P-type transistor, which may transfer charges of the first supply node N1 to the second data node Data_bar as much as possible.

Moreover, in a subsequent read phase of the page buffer 622, a large charge amount of the first data node Data ensures that an on-degree (i.e., a magnitude relationship of a voltage difference between the control electrode and the first electrode and a threshold voltage is characterized as the on-degree of the transistor) of the fifth transistor T5 reaches a target degree (a maximum on-degree based on the threshold voltage of the fifth transistor T5). As such, the fifth transistor T5 transmits the level of the second data node Data_bar to the sense node SO as much as possible when implementing an on-state in response to the level of the first data node Data, which is favorable to improving the sensitivity and accuracy of acquiring a data change of the latch circuit 6223 by the sense node SO.

In some examples, at least two latch circuits 6223 in the page buffer 622 may share one latch transmission circuit 6204. For example, two latch circuits 6223 share one latch transmission circuit 6204. In this way, the structure of the page buffer 622 occupies less area, further reducing the area of the memory device 60, which is favorable to realizing a high degree of integration and a small size of the memory device 60.

Based on the structure of the latch circuit 6223 provided in the above examples, as shown in FIG. 15, the latch circuit 6223 comprises six transistors. In conjunction with the structure of the latch 6211 shown in FIG. 7, the number of the transistors in the latch circuit 6223 of the present application is reduced by two, thus reducing the costs of and the space in the memory device 60 occupied by the page buffer 622. A reduction in the number of the transistors of the two phase inverters 6211 reduces a peak current generated when the two phase inverters transmit a signal through a plurality of transistors, thus improving the stability of the signal transmission of the page buffer 622.

Moreover, while realizing functions of charge and discharge operations on the sense node SO, the stability of the level signal transmission through a line between the latch circuit 6223 and the sense node SO is improved, improving the accuracy of sensing the signal by the sense node SO and thereby improving the performance of the page buffer 622.

Figure 16:
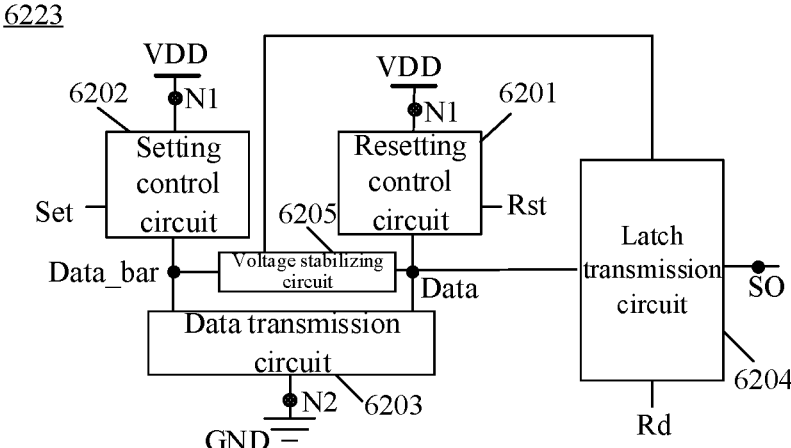
FIG. 16 is a schematic structural diagram I of a voltage stabilizing circuit of the page buffer provided by the examples of the present application.
Figure 17:
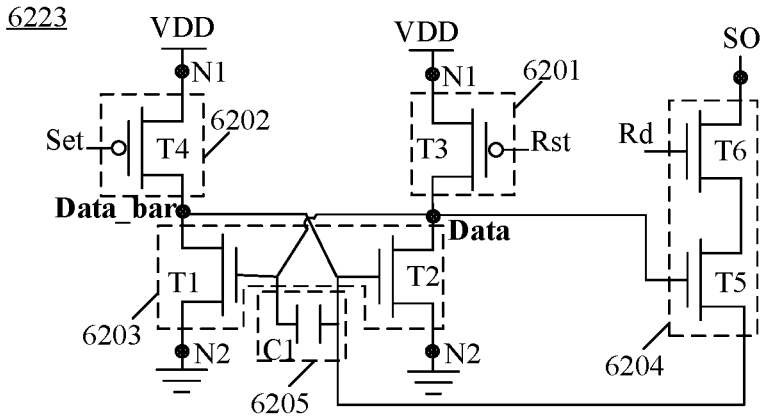
FIG. 17 is a schematic diagram I of a logic circuit of the voltage stabilizing circuit of the page buffer provided by the examples of the present application.
Figure 18:
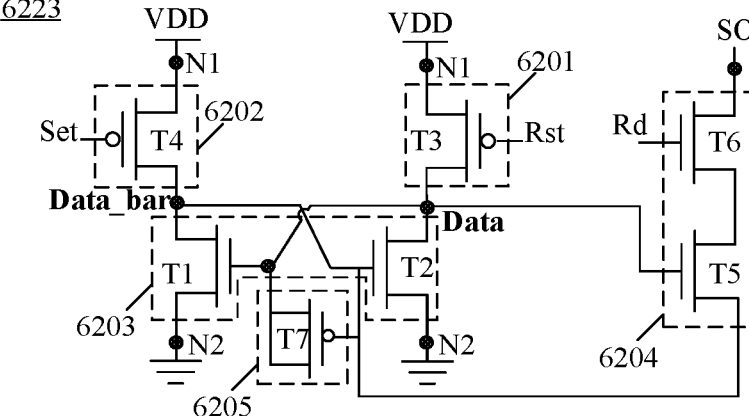
FIG. 18 is a schematic diagram II of the logic circuit of the voltage stabilizing circuit of the page buffer provided by the examples of the present application.

In some examples, as shown in FIG. 16 to FIG. 18, the latch circuit 6223 further comprises a voltage stabilizing circuit 6205. As shown in FIG. 16, the voltage stabilizing circuit 6205 is coupled with the first data node Data and the second data node Data_bar and configured to stabilize a voltage difference between the first data node Data and the second data node Data_bar.

In an example, as shown in FIG. 17, the voltage stabilizing circuit 6205 comprises a capacitor C1. A first plate of the capacitor C1 is coupled with the first data node Data, and a second plate of the capacitor C2 is coupled with the second data node Data_bar. As such, the capacitor C1 maintains a voltage difference between the first plate and the second plate as being stable under a bootstrap effect thereof, thereby stabilizing the voltage difference between the first data node Data and the second data node Data_bar, so that a voltage difference between the control electrode and the first electrode of the fifth transistor T5 is stable, i.e., ensuring that the signal flowing through the fifth transistor T5 is stable.

In a further example, as shown in FIG. 18, the voltage stabilizing circuit 6206 comprises a seventh transistor T7. A control electrode of the seventh transistor T7 is coupled with the second data node Data_bar, and a first electrode and a second electrode of the seventh transistor T7 are both coupled with the first data node Data. As such, the first electrode and the second electrode of the seventh transistor T7 are coupled with the same node (i.e., the first data node Data), so that the level of the first data node Data may be maintained as being stable regardless of whether the seventh transistor T7 is turned on or off under control of a level signal of the second data node Data_bar. Accordingly, an on-degree of the first transistor T1 controlled by the level of the first data node Data is stable, and the level of the second data node Data_bar is stable. Therefore, the voltage difference between the control electrode and the first electrode of the fifth transistor T5 is stable, i.e., ensuring that the signal flowing through the fifth transistor T5 is stable.

For example, the seventh transistor T7 is a P-type transistor. As such, a property of the P-type transistor being turned on under control of a low level signal is taken into consideration. In order to reduce the loss generated by the transmission of the level signal in a circuit signal line, which causes the problem that the level signal received by the control electrode of the transistor fails to turn on the transistor or the on-degree of the transistor is poor (i.e., the magnitude relationship of the voltage difference between the control electrode and the first electrode and the threshold voltage is characterized as the on-degree of the transistor), the P-type transistor is disposed between the first data node Data and the second data node Data_bar, so as to improve the sensitivity of sensing level changes of the first data node Data and the second data node Data_bar and improve a voltage stabilizing effect.

Furthermore, the voltage stabilizing circuit 6205 may also be a circuit comprising other electronic elements that have a voltage stabilizing effect. In an example, the voltage stabilizing circuit 6205 comprises electronic elements such as a voltage stabilizing diode or a linear regulator (e.g., a low dropout regulator (LDO)). The examples of the present application do not impose limitations thereto.

For ease of understanding, based on the page buffer 622 having the latch circuit 6223 provided in the above examples, a process of implementing data latch for one latch circuit 6223 and adjusting the potential of the sense node SO are illustrated in an example. It is to be noted that other latch circuits 6223 in the page buffer 622 may perform similar methods for a data setting operation.

Figure 20:
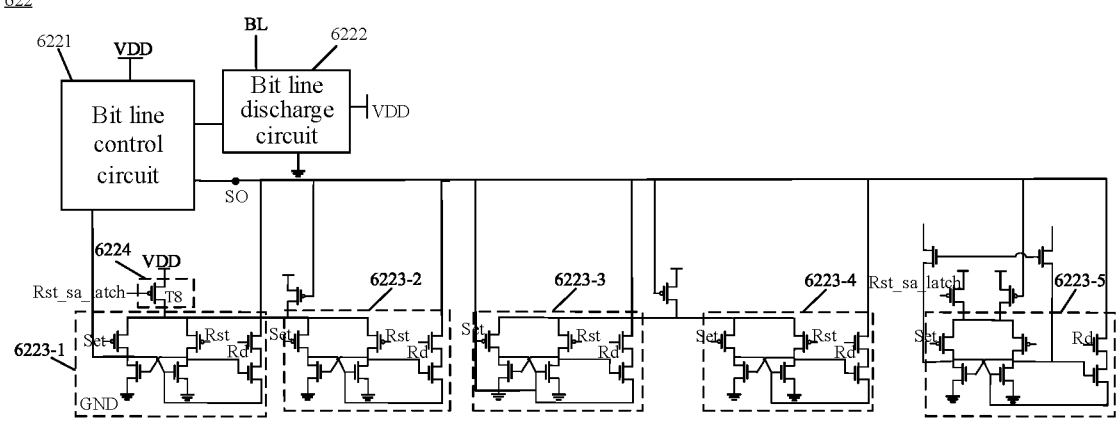
FIG. 20 is a schematic diagram of a logic circuit of the page buffer provided by the examples of the present application.

As shown in FIG. 20, the page buffer 622 comprises the bit line control circuit 6221, the bit line discharge circuit 6222, and five latch circuits 6223. The five latch circuits 6223 include a sense latch circuit 6223-1, three data latch circuits 6223-2, 6223-3, and 6223-4, and a cache latch circuit 6223-5.

The sense node SO is charged via the bit line control circuit 6221, so that the sense node SO has a high level (e.g., a supply voltage VDD). Meanwhile, (an eighth transistor T8 and) the third transistor T3 in FIG. 15 is turned on, so that the supply voltage VDD from a supply voltage end may be provided to the first data node Data of the sense latch circuit 6223-1, that is, data latched by the sense latch circuit 6223-1 is "1". Alternatively, the fourth transistor T4 in FIG. 15 is turned on, so that a ground voltage VSS may be provided to the first data node Data of the sense latch circuit 6223-1, that is, data latched by the sense latch circuit 6223-1 is "0".

It is to be noted that the data "1" may represent a high level or a low level, and the data "0" may represent a low level or a high level. In the examples of the present application, the illustration is performed by taking the data "1" representing the high level and the data "0" representing the low level as an example.

The sense latch circuit 6223-1 receives the enabled transmission signal rd (for example, the rd signal is a low level signal), and the latch transmission circuit 6204 in the sense latch circuit 6223-1 is turned on. If data stored in the sense latch circuit 6223-1 is "1", a high voltage on the sense node SO may be discharged to a low voltage through the latch transmission circuit 6204. If the data stored in the sense latch circuit 6223-1 is "0", the latch transmission circuit 6204 in the sense latch circuit 6223-1 is cut off, the high voltage on the sense node SO cannot be discharged through the latch transmission circuit 6204, and the voltage on the sense node SO is still the high voltage.

Therefore, data information stored in the sense latch circuit 6223-1 may be obtained by sensing the voltage at the sense node SO at this time. Similarly, data information stored in the respective latch circuits 6223 may be sensed using the various latch circuits 6223.

Furthermore, with continued reference to FIG. 20, the page buffer 622 further comprises a data setting circuit 6224. The data setting circuit 6224 is a force setting circuit, that is, when the data setting signal rst_sa_latch is enabled (for example, the rst_sa_latch signal is a low level signal), regardless of a magnitude of the voltage of the sense node SO at this time, data setting may be performed on the designated latch circuit 6223.

In an example, as shown in FIG. 20, the data setting circuit 6224 comprises the eighth transistor T8. A control electrode of the eighth transistor T8 is configured to receive the data setting signal rst_sa_latch; a first electrode of the eighth transistor T8 is coupled with the latch circuit 6223; and a second electrode of the eighth transistor T8 is coupled with the supply voltage VDD.

The eighth transistor T8 includes, but is not limited to, a P-type transistor or an N-type transistor. In the examples of the present application, the illustration is performed by taking the eighth transistor T8 being the P-type transistor as an example.

In the examples of the present application, prior to enabling the page buffer 622, a data set or reset operation may be performed on one or more of the latch circuits 6223 in the page buffer 622 using the data setting circuit 6224. For example, the binary data "0" may be used to represent a reset operation, and "1" may represent a set operation.

In some examples, the peripheral circuit 62 further comprises a control logic circuit (not shown in FIG. 20). The control logic circuit is coupled with the data setting circuit 6224 of the page buffer 622 and configured to generate the data setting signal rst_sa_latch. For example, the control logic unit 625 shown in FIG. 5 comprises the control logic circuit.

The control logic circuit may be further configured to generate various control signals required by the page buffer 100, including, but not limited to, the data setting signal rst_sa_latch.

Figure 21A:
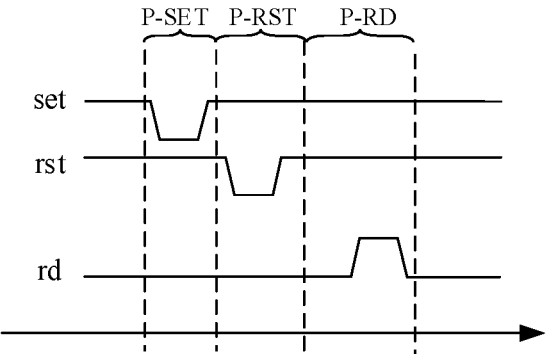
FIG. 21A is a timing diagram I of the latch circuit of the page buffer provided by the examples of the present application.
Figure 21B:
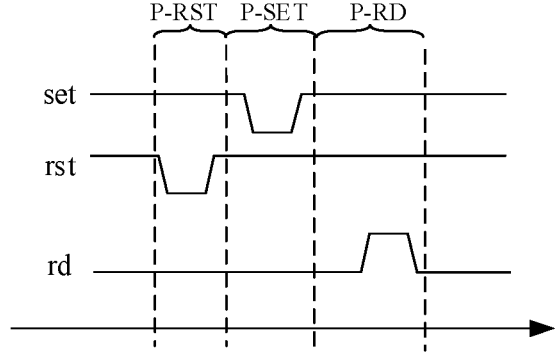
FIG. 21B is a timing diagram II of the latch circuit of the page buffer provided by the examples of the present application.
Figure 22:
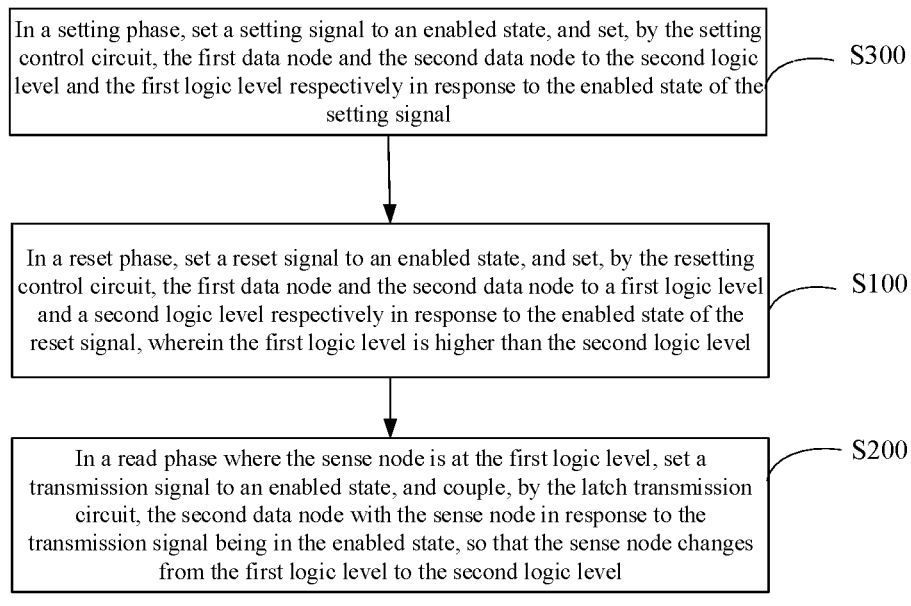
FIG. 22 is a flow diagram of an operation method of the page buffer provided in FIG. 21A.
Figure 23:
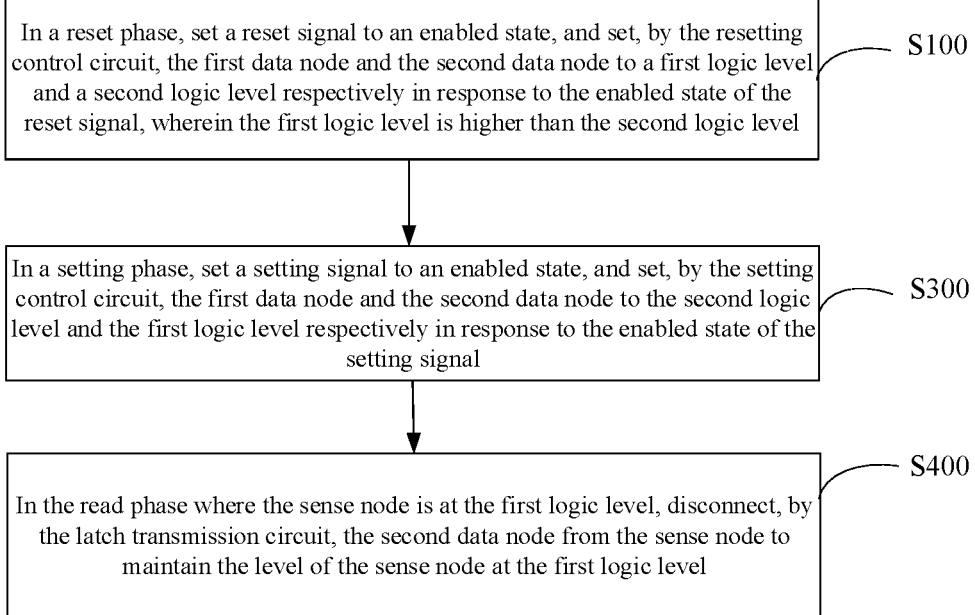
FIG. 23 is a flow diagram of an operation method of the page buffer provided in FIG. 21B.

On the other hand, based on the page buffer 622 provided in any of the above examples (referring to FIG. 8 to FIG. 20), as shown in FIG. 22 and FIG. 23, the examples of the present application further provide an operation method of the page buffer 622. In conjunction with FIG. 19, FIG. 20, FIG. 21A, and FIG. 21B, the operation method of the page buffer 622 is illustrated in an example. The circuit structure shown in FIG. 15 is taken as an example of the latch circuit 6223 of the page buffer 622. The operation method of the page buffer 622 of the present application does not limit all of the latch circuits 6223 as being the circuit structure shown in FIG. 15, for example, the latch circuits 6223 may also include a circuit structure of the voltage stabilizing circuit 6205 as shown in FIG. 16 to FIG. 18.

As shown in FIG. 19, the page buffer 622 comprises the bit line control circuit 6221, the bit line discharge circuit 6222, and the plurality of latch circuits 6223.

The bit line control circuit 6221 is coupled with the first supply voltage node N1 (e.g. the transmission supply voltage VDD), the bit line BL, and the sense node SO, and is configured to control the potential level of the sense node SO during the sense operation based on the current level of the bit line BL.

In an example, the bit line control circuit 6221 may set the voltage at the sense node SO through the data latched in the sense latch circuit 6223, and may also set the voltage at the sense node SO directly in response to level signals of a Prech_all_en end and a Prech_sel_en end based on the supply voltage VDD provided by the first supply voltage node N1. For example, when the signals transmitted at the Prech_all_en end and the Prech_sel_en end are enabled at the same time, the supply voltage (e.g., VDD) may be applied to the sense node SO through the bit line control circuit 6221.

During a process of programming the memory cell, a program inhibit bit line voltage (e.g., VDD) or a normal program bit line voltage (e.g., VSS) may be applied to the bit line BL coupled with the memory cell via the bit line control circuit 6221. In an example, a high level is applied to the bit line through a charge function of the bit line control circuit 6221 to achieve an effect of inhibiting the program, or the bit line is discharged through a discharge function of the bit line control circuit 6221, so that the voltage of the bit line is pulled down to the ground voltage to achieve an effect of allowing the program. The normal program bit line voltage<the program inhibit bit line voltage.

The bit line discharge circuit 6222 is coupled between the bit line BL and the second supply voltage node N2 (e.g., the transmission ground voltage GND) and is configured to discharge the potential level of the bit line BL in response to the discharge control signal prech_all_en.

In an example, the bit line discharge circuit 6222 may be a combination of a plurality of N-type transistors and/or P-type transistors. Alternatively, the bit line discharge circuit 6222 comprises components that may be used for clamping or regulating voltages, e.g., one or more components among a Zener diode, a transient voltage suppressor, and a piezoresistor, etc. In an example, the bit line discharge circuit 6222 may generate different bit line force voltages based on different electronic components. For example, a first bit line force voltage and a second bit line force voltage. The normal program bit line voltage<the first bit line force voltage<the second bit line force voltage<the program inhibit bit line voltage.

As such, fine program of the memory cell can be achieved by applying the different bit line force voltages to the bit line BL using the bit line discharge circuit 6222, such that a target threshold voltage distribution is narrower, increasing a read window between the memory cells in different programmed states and thus ensuring accurate data read.

The plurality of latch circuits 6223 are coupled with the sense node SO, and charge and discharge the level of the sense node SO under driving of the bit line control circuit 6221 and the bit line discharge circuit 6222. As shown in FIG. 10, each latch circuit 6223 comprises the resetting control circuit 6201 coupled with the first data node Data, the setting control circuit 6202 coupled with the second data node Data_bar, the data transmission circuit 6203 coupled with both the first data node Data and the second data node Data_bar, and the latch transmission circuit 6204 coupled with the first data node Data, the second data node Data_bar, and the sense node SO.

In some examples, as shown in FIG. 19, in the bit line control circuit 6221, when the signal prech_sel_en and the signal prech_all_en are enabled at the same time, the supply voltage (e.g., VDD) may be applied to the sense node SO directly.

At this time, as shown in FIG. 15, the level of the second data node Data_bar is the high level, and the level of the first data node Data is the low level. As such, under a joint action of the first transistor T1 and the second transistor T2 in the latch circuit 6223 (that is, the fifth transistor T5 is turned off), the latch circuit 6223 does not discharge the level of the sense node SO. The level of the sense node SO is the supply voltage VDD applied by the bit line control circuit 6221.

Accordingly, as shown in FIG. 19, when the bit line control circuit 6221 couples the bit line BL and the sense node SO in response to a signal vbias and a signal vsoblk being both enabled, the bit line BL acquires the data stored in the latch circuit 6223 by reading the level of the sense node SO. For example, the level of the sense node SO is unchanged. Data read by the bit line BL is "1", and then it may be deduced that the data latched by the latch circuit 6223 is "1".

Alternatively, with continued reference to FIG. 19, when the signal prech_sel_en is in the enabled state and the signal prech_all_en is not in the enabled state, the bit line control circuit 6221 applies the supply voltage (VDD) to the sense node SO in response to the signal transmitted by the latch circuit 6223.

At this time, as shown in FIG. 15, the level of the second data node Data_bar is the low level, and the level of the first data node Data is the high level. Under a joint action of the first transistor T1 and the second transistor T2 in the latch circuit 6223 (that is, the fifth transistor T5 is turned on), in response to the signal rd being enabled, the latch circuit 6223 is coupled with the sense node SO to discharge the level of the sense node SO. That is, the level of sense node SO is discharged from the supply voltage VDD. In this way, when the signal vbias and the signal vsoblk are enabled at the same time, the level signal of the sense node SO is fed back to the bit line BL. The bit line BL acquires the data stored in the latch circuit 6223 by reading the level of the sense node SO. For example, the level of the sense node SO is changed. Data read by the bit line BL is "0", and then it may be deduced that the data latched by the latch circuit 6223 is "1".

In order to reflect a driving process of the latch circuit 6223 of the page buffer 622 more clearly, the above operations are described in detail below in conjunction with timing diagrams shown in FIG. 21A and FIG. 21B, taking the latch circuit 6223 shown in FIG. 15 as an example.

As shown in FIG. 15, the latch circuit 6223 comprises the resetting control circuit 6201, the setting control circuit 6202, the data transmission circuit 6203, and the latch transmission circuit 6204.

The resetting control circuit 6201 comprises the third transistor T3. The third transistor T3 is a P-type transistor.

The setting control circuit 6202 comprises the fourth transistor T4. The fourth transistor T4 is a P-type transistor.

The data transmission circuit 6203 comprises the first transistor T1 and the second transistor T2. The first transistor T1 and the second transistor T2 are both N-type transistors.

The latch transmission circuit 6204 comprises the fifth transistor T5 and the sixth transistor T6 connected in series. The fifth transistor T5 and the sixth transistor T6 are both N-type transistors.

On that basis, as shown in FIG. 22 and FIG. 23, the operation method comprises at least S100, S200, S300, and S400. As shown in FIG. 21A and FIG. 21B, an operation process of the page buffer 622 comprises three phases: a setting phase P-SET, a reset phase P-RST, and a read phase P-RD. Moreover, the timing diagrams provided by FIG. 21A and FIG. 21B only represent example signals employed during the driving process of the latch circuit 6223. The different phases may be spaced apart by a certain time interval or may be adjacent to each other, and the present application do not impose limitations in this respect.

Meanwhile, the latch circuit 6223 has a characteristic, that is, in different phases, the latch circuit 6223 causes logic levels of the first data node Data and the second data node Data_bar coupled with the latch transmission circuit 6204 to be opposite, in response to configuration signals of the opposite logic levels (for example, the setting signal set and the reset signal rst have opposite logic levels in the same phase).

For example, as shown in FIG. 21A, a phase prior to the read phase P-RD may be the reset phase P-RST, and the logic levels of the first data node Data and the second data node Data_bar obtained in the reset phase P-RST are a group of target levels. Based on the characteristic of the latch circuit 6223, a process that causes the logic levels of the first data node Data and the second data node Data_bar to be opposite to the group of target levels is necessarily present prior to the reset phase P-RST (e.g., the setting phase P-SET).

Alternatively, as shown in FIG. 21B, a phase prior to the read phase P-RD may be the setting phase P-SET, and the logic levels of the first data node Data and the second data node Data_bar obtained in the setting phase P-SET are a group of target levels. Based on the characteristic of the latch circuit 6223, a process that causes the logic levels of the first data node Data and the second data node Data_bar to be opposite to the group of target levels is necessarily present prior to the setting phase P-SET (e.g., the reset phase P-RST).

Moreover, states of the plurality of latch circuits 6223 in different page buffers 622 may be the same or different, for example, part of the latch circuits 6223 perform data write operations, and the other part of the latch circuits 6223 perform active data transmission operations. That is, data latched in a phase (the setting phase P-SET or the reset phase P-RST) prior to a current state of the latch circuit 6223 is read in the read phase P-RD. In this way, if the different latch circuits 6223 transmit different signals in the same time period, different pieces of data are read in the read phase P-RD.

Thus, as shown in FIG. 21A and FIG. 21B, two sequential orders of the setting phase P-SET and the reset phase P-RST are reflected in the same timing process.

In order to clearly distinguish different operation methods of acquiring data in read phases P-RD of the different latch circuits 6223, the illustration is performed by taking the two operation methods shown in FIG. 21A and FIG. 22 as well as FIG. 21B and FIG. 23 as an example.

In some examples, as shown in FIG. 21A and FIG. 22, the operation process of the page buffer 622 comprises the setting phase P-SET, the reset phase P-RST following the setting phase P-SET, and the read phase P-RD following the reset phase P-RST.

In an example, as shown in FIG. 15, FIG. 21A, and FIG. 22, the operation method comprises S300, S100, and S200.

S300: In the setting phase P-SET, the setting control circuit 6202 sets the first data node Data and the second data node Data_bar to the second logic level and the first logic level respectively in response to the enabled state of the setting signal set. The first logic level is higher than the second logic level.

In an example, with continued reference to FIG. 15 and FIG. 21A, a precharge operation is performed on the sense node SO such that the sense node SO has the first logic level. For example, the first logic level is VDD.

The fourth transistor T4 of the setting control circuit 6202 is turned on in response to the signal set being in the enabled state, so as to couple the first supply voltage node N1 with the second data node Data_bar, so that the first logic level is transmitted to the control electrode of the second transistor T2 in the data transmission circuit 6203. The second transistor T2 is turned on to transmit the second logic level (e.g., VSS) of the second supply voltage node N2 to the first data node Data. The first logic level VDD is higher than the second logic level VSS.

At this time, the third transistor T3 of the resetting control circuit 6201 is turned off in response to the reset signal rst being in a disabled state, and the level of the first data node Data is maintained at the second logic level.

Meanwhile, the first transistor T1 in the data transmission circuit 6203 is turned off in response to the second logic level of the first data node Data, and the level of the second data node Data_bar is maintained at the first logic level.

In this way, the fifth transistor T5 of the latch transmission circuit 6204 is turned off in response to the second logic level signal of the first data node Data. The latch circuit 6223 is disconnected from the sense node SO, and the sense node SO is maintained at the first logic level.

S100: In the reset phase P-RST, the resetting control circuit 6201 initializes the first data node Data and the second data node Data_bar to the first logic level and the second logic level respectively in response to the enabled state of the reset signal rst.

In an example, with continued reference to FIG. 15 and FIG. 21A, in the resetting control circuit 6201, in response to the enabled state of the reset signal rst (for example, the reset signal rst is a low level signal), the third transistor T3 of the resetting control circuit 6201 is turned on to transmit the level of the first supply voltage node N1 to the first data node Data, so that the level of the first data node Data is set to the first logic level.

The first transistor T1 of the data transmission circuit 6203 is turned on in response to the first logic level (e.g., VDD) of the first data node Data, so as to transmit the level of the second supply voltage node N2 to the second data node Data_bar, so that the level of the second data node Data_bar is set to the second logic level (e.g., VSS). The first logic level is higher than the second logic level.

Meanwhile, the fourth transistor T4 of the setting control circuit 6202 is turned off in response to the setting signal set being in a disabled state (the setting signal set is at the high level), and the level of the second data node Data_bar is maintained at the second logic level.

In this way, the fifth transistor T5 of the latch transmission circuit 6204 is turned on in response to the first logic level of the first data node Data. However, since the sixth transistor T6 is turned off in response to the transmission signal rd being in a disabled state (e.g., the transmission signal rd is at the low level), the latch circuit 6223 is disconnected from the sense node SO, and the sense node SO is maintained at the first logic level.

Based on the above operation process, the level of the sense node SO is the first logic level. A program operation is performed on the latch circuit 6223 via the bit line BL, and the latch circuit 6223 latches target data. Data set in the reset phase P-RST is read in the subsequent read phase P-RD.

S200: In the read phase P-RD following the reset phase P-RST where the sense node SO is at the first logic level, the latch transmission circuit 6204 couples the second data node Data_bar with the sense node SO in response to the transmission signal rd being in the enabled state, so as to transmit the second logic level of the second data node Data_bar to the sense node SO. The sense node SO changes from the first logic level to the second logic level.

In an example, with continued reference to FIG. 15 and FIG. 21A, after S100, the first data node Data has the second logic level, and the second data node Data_bar has the first logic level. The fifth transistor T5 of the latch transmission circuit 6204 is turned on in response to the first logic level of the first data node Data, and the sixth transistor T6 is turned on in response to the transmission signal rd, so as to couple the second data node Data_bar with the sense node SO. Therefore, the second logic level of the second data node Data_bar is transmitted to the sense node SO.

As such, the sense node SO changes from the first logic level to the second logic level. That is, the bit line BL reads the data of the latch circuit 6223 through a level change of the sense node SO. Accordingly, the read data can be latched to other latch circuits 6223 via the bit line BL.

In some other examples, as shown in FIG. 21B and FIG. 23, the operation process of the page buffer 622 comprises the reset phase P-RST, the setting phase P-SET following the reset phase P-RST, and the read phase P-RD following the setting phase P-SET.

In an example, as shown in FIG. 15, FIG. 21B, and FIG. 23, the operation method comprises S100, S300, and S400.

S100: In the reset phase P-RST, the resetting control circuit 6201 initializes the first data node Data and the second data node Data_bar to the first logic level and the second logic level respectively in response to the enabled state of the reset signal rst.

In an example, first, the precharge operation is performed on the sense node SO such that the sense node SO has the first logic level. For example, the first logic level is VDD.

With continued reference to FIG. 15 and FIG. 21B, in the resetting control circuit 6201, in response to the enabled state of the reset signal rst, the third transistor T3 of the resetting control circuit 6201 is turned on to transmit the level of the first supply voltage node N1 to the first data node Data, so that the level of the first data node Data is set to the first logic level.

The first transistor T1 of the data transmission circuit 6203 is turned on in response to the first logic level of the first data node Data, so as to transmit the level of the second supply voltage node N2 to the second data node Data_bar, so that the level of the second data node Data_bar is set to the second logic level. The first logic level is higher than the second logic level. For example, the first logic level is VDD, and the second logic level is VSS.

Meanwhile, the fourth transistor T4 of the setting control circuit 6202 is turned off in response to the setting signal set being in the disabled state, and the level of the second data node Data_bar is maintained at the second logic level.

In this way, the fifth transistor T5 of the latch transmission circuit 6204 is turned on in response to the first logic level of the first data node Data. However, since the sixth transistor T6 is turned off in response to the transmission signal rd being in the disabled state, the latch circuit 6223 is disconnected from the sense node SO, the level of the sense node SO is not pulled down, and the sense node SO is maintained at the first logic level.

S300: In the setting phase P-SET, the setting control circuit 6202 sets the first data node Data and the second data node Data_bar to the second logic level and the first logic level respectively in response to the enabled state of the setting signal set.

In an example, with continued reference to FIG. 15 and FIG. 21B, the fourth transistor T4 of the setting control circuit 6202 is turned on in response to the signal set being in the enabled state, so as to couple the first supply voltage node N1 with the second data node Data_bar, so that the first logic level is transmitted to the control electrode of the second transistor T2 in the data transmission circuit 6203. The second transistor T2 is turned on to transmit the second logic level of the second supply voltage node N2 to the first data node Data. For example, the second logic level is VSS. The first logic level VDD is higher than the second logic level VSS.

At this time, the third transistor T3 of the resetting control circuit 6201 is turned off in response to the reset signal rst being in the disabled state, and the level of the first data node Data is maintained at the second logic level. Meanwhile, the first transistor T1 in the data transmission circuit 6203 is turned off in response to the second logic level of the first data node Data, and the level of the second data node Data_bar is maintained at the first logic level.

In this way, the fifth transistor T5 of the latch transmission circuit 6204 is turned off in response to the second logic level signal of the first data node Data. The latch circuit 6223 is disconnected from the sense node SO, and the sense node SO is maintained at the first logic level.

Based on the above operation process, the level of the sense node SO is the first logic level. A program operation is performed on the latch circuit 6223 via the bit line BL, and the latch circuit 6223 latches target data. Data set in the setting phase P-SET is read in the subsequent read phase P-RD.

S400: In the read phase P-RD following the setting phase P-SET where the sense node SO is at the first logic level, the latch transmission circuit 6204 disconnects the second data node Data_bar from the sense node SO, so that the level of the sense node SO is maintained at the first logic level.

In an example, with continued reference to FIG. 15 and FIG. 21B, after S300, the first data node Data has the second logic level, and the second data node Data_bar has the first logic level. The fifth transistor T5 of the latch transmission circuit 6204 is turned off in response to the second logic level signal of the first data node Data.

On that basis, regardless of whether the transmission signal rd is in the enabled state (that is, if the signal rd is a high level signal, the sixth transistor T6 is turned off; or if the signal rd is a low level signal, the sixth transistor T6 is in an on state), the second data node Data_bar is disconnected from the sense node SO, so that the level of the sense node SO is maintained at the first logic level. As such, the bit line BL reads the data of the latch circuit 6223 continuously through the sense node SO.

The operation method of the page buffer 622 provided by the present application comprises two flows as shown in FIG. 22 and FIG. 23. One is based on the level signals stored at the first data node Data and the second data node Data_bar in the reset phase P-RST, wherein the latch transmission circuit 6204 is connected with the sense node SO in the read phase P-RD via the enabled state of the transmission signal rd, so that the level of the sense node SO is changed. The other one is based on the level signals stored at the first data node Data and the second data node Data_bar in the setting phase P-SET, wherein the latch transmission circuit 6202 is disconnected from the sense node SO in the read phase P-RD even in the case of a response to the enabled state of the transmission signal rd, so that the level of the sense node SO is maintained. The two flows are based on a plurality of latch circuits of different page buffers, and different latch circuits may be in different states in the same time period, which is characterized in that the operation process of the page buffer 622 may be, during the read phase P-RD, reading data stored in the setting phase P-SET or reading data stored in the reset phase P-RST. In this way, during the read phase P-RD, the latch circuits 6223 of the different page buffers 622 affect the level of the sense node SO differently, thereby acquiring different pieces of data of the different page buffers 622 through the sense node SO. The circuit structure of the page buffer 622 provided by the present application can achieve data read of the memory cells in different states.

In view of above, examples of the present application provide a page buffer and an operation method thereof, a memory device, and a memory system.

In a first aspect, examples of the present application provide a page buffer. The page buffer comprises a plurality of latch circuits. Each of the latch circuits comprises a resetting control circuit, a setting control circuit, a data transmission circuit, and a latch transmission circuit. The resetting control circuit is coupled to a first data node and configured to receive a first supply voltage, so as to determine a potential of the first data node. The setting control circuit is coupled to a second data node and configured to receive the first supply voltage, so as to determine a potential of the second data node. The data transmission circuit is coupled to the first data node and the second data node and configured to receive a second supply voltage. The latch transmission circuit is coupled to the first data node, the second data node, and a sense node. The first supply voltage is higher than the second supply voltage.

In some examples, the setting control circuit is configured to set the second data node and the first data node to a first logic level and a second logic level respectively in response to a setting signal being in an enabled state, wherein the first logic level is higher than the second logic level.

The resetting control circuit is configured to set the first data node and the second data node to the first logic level and the second logic level respectively in response to a reset signal being in an enabled state.

The latch transmission circuit is configured to couple the second data node with the sense node in response to a transmission signal being in an enabled state and the first data node and the second data node being at the first logic level and the second logic level respectively, wherein the sense node is at the second logic level.

In some examples, the latch transmission circuit is further configured to, when the sense node is at the first logic level, maintain the sense node at the first logic level in response to the transmission signal being in the enabled state and the first data node and the second data node being at the second logic level and the first logic level respectively.

In some examples, the data transmission circuit comprises a first transistor and a second transistor. A control electrode of the first transistor is coupled with the first data node, a first electrode of the first transistor is coupled with a second supply voltage node, and a second electrode of the first transistor is coupled with the second data node. A control electrode of the second transistor is coupled with the second data node, a first electrode of the second transistor is coupled with a second supply voltage node, and a second electrode of the second transistor is coupled with the first data node.

In some examples, the resetting control circuit comprises a third transistor, a control electrode of the third transistor receives the reset signal, a first electrode of the third transistor is coupled with a first supply voltage node, and a second electrode of the third transistor is coupled with the first data node.

The setting control circuit comprises a fourth transistor, a control electrode of the fourth transistor receives the setting signal, a first electrode of the fourth transistor is coupled with the first supply voltage node, and a second electrode of the fourth transistor is coupled with the second data node.

In some examples, the latch transmission circuit comprises a fifth transistor and a sixth transistor in a serial cascade relationship; and the fifth transistor and the sixth transistor are N-type transistors.

In some examples, a control electrode of the fifth transistor is coupled with the first data node, a first electrode of the fifth transistor is coupled with the second data node, and a second electrode of the fifth transistor is coupled with a first electrode of the sixth transistor. A control electrode of the sixth transistor receives the transmission signal, and a second electrode of the sixth transistor is coupled with the sense node.

In some examples, the latch circuit further comprises a voltage stabilizing circuit. The voltage stabilizing circuit is coupled with the first data node and the second data node and configured to stabilize a voltage difference between the first data node and the second data node.

In some examples, the voltage stabilizing circuit comprises a capacitor. A first plate of the capacitor is coupled with the first data node, and a second plate of the capacitor is coupled with the second data node.

In some example, the voltage stabilizing circuit comprises a seventh transistor. A control electrode of the seventh transistor is coupled with the second data node, and a first electrode and a second electrode of the seventh transistor are both coupled with the first data node.

In some examples, the page buffer further comprises a bit line control circuit and a bit line discharge circuit. The bit line control circuit is coupled with a first supply voltage node, a bit line, and the sense node and configured to control a potential level of the sense node during a sense operation based on a current level of the bit line. The bit line discharge circuit is coupled between the bit line and a second supply voltage node and configured to discharge a potential level of the bit line in response to a discharge control signal.

The present application couples the first data node and the second data node via the latch transmission circuit in the page buffer. As such, without coupling the latch transmission circuit with a ground voltage node, the latch transmission circuit is controlled to be connected with or disconnected from the sense node based solely on logic levels of the first data node Data and the second data node Data_bar obtained under a joint action of the data transmission circuit 6203, the setting circuit 6202, and the resetting control circuit 6201, thus reducing grounding line structures. Moreover, the number of electronic elements (e.g., transistors) is also reduced due to not directly using phase inverters, thereby reducing fabrication costs of and a space in a memory device occupied by the page buffer. In the case where the memory device comprises a page buffer group or comprises page buffers for driving a multi level cell type, the fabrication costs of and the space occupied by the page buffer may be reduced significantly.

Moreover, due to the simplified circuit structure, the complexity of a signal transmission path between the page buffer and the sense node is reduced, a loss during transmission of the level signal is reduced, and thus the overall performance of the memory device is improved.

In another aspect, the present application provides a memory device. The memory device comprises a memory cell array and a plurality of page buffers provided in any of the above examples. The memory cell array is coupled with a plurality of bit lines. Each of the page buffers is coupled with one of the bit lines and configured to perform a sense operation based on a current level of the bit line.

The memory device provided in this example achieves the same beneficial effect as the beneficial effect of the page buffer provided in any of the above examples, which is no longer repeated here.

In further another aspect, the present application provides a memory system. The memory system comprises one or more memory devices provided in any of the above examples and a memory controller. The memory controller is coupled with the memory devices and configured to control the memory devices.

The memory system provided in this example achieves the same beneficial effect as the beneficial effect of the memory device provided in any of the above examples, which is no longer repeated here.

In yet another aspect, the present application provides an operation method of a page buffer. The page buffer comprises a plurality of latch circuits, each comprising a resetting control circuit coupled with a first data node, a setting control circuit coupled with a second data node, and a data transmission circuit coupled with both the first data node and the second data node; and a latch transmission circuit coupled with the first data node, the second data node, and a sense node.

The operation method comprises:

in a reset phase, setting a reset signal to an enabled state, and setting, by the resetting control circuit, the first data node and the second data node to a first logic level and a second logic level respectively in response to the enabled state of the reset signal, wherein the first logic level is higher than the second logic level; and in a read phase following the reset phase where the sense node is at the first logic level, setting a transmission signal to an enabled state, and coupling, by the latch transmission circuit, the second data node with the sense node in response to the transmission signal being in the enabled state, so that the sense node changes from the first logic level to the second logic level.

In some examples, the operation method further comprises:

in a setting phase, setting a setting signal to an enabled state, and setting, by the setting control circuit, the first data node and the second data node to the second logic level and the first logic level respectively in response to the enabled state of the setting signal; and in a read phase following the setting phase where the sense node is at the first logic level, disconnecting, by the latch transmission circuit, the second data node from the sense node to maintain the level of the sense node at the first logic level.

The operation method of the page buffer provided by the present application comprises two flows. One is based on the level signals stored at the first data node and the second data node in the reset phase, wherein the second data node is coupled with the sense node in the read phase via the enabled state of the transmission signal, so that the level of the sense node is changed. The other one is based on the level signals stored at the first data node and the second data node in the setting phase, wherein the second data node is disconnected from the sense node in the read phase even in the case of a response to the enabled state of the transmission signal, so that the level of the sense node is maintained. The two flows are based on a plurality of latch circuits included in different page buffers, and different latch circuits may be in different states in the same time period, which is characterized in that the operation process of the page buffer may be, during the read phase, reading data stored in the setting phase or reading data stored in the reset phase. In this way, during the read phase, the latch circuits of the different page buffers affect the level of the sense node differently, thereby acquiring different pieces of data of the different page buffers through the sense node. The circuit structure of the page buffer provided by the present application can achieve data read of memory cells in different states.

It is to be understood that, references to "some implementations" or "some examples" throughout this specification mean that particular features, structures, or characteristics related to the examples are included in at least one example of the present application. Therefore, "in some examples" or "in an example" presented everywhere throughout this specification does not necessarily refer to the same example. Furthermore, these particular features, structures, or characteristics may be incorporated in one or more examples in any suitable manner. It is to be understood that, in various examples of the present application, sequence numbers of the above processes do not indicate an execution sequence, and an execution sequence of various processes shall be determined by functionalities and intrinsic logics thereof, and shall constitute no limitation on an implementation process of the examples of the present application. The above sequence numbers of the examples of the present application are only for description, and do not represent advantageous and disadvantageous of the examples.

It is to be noted that, the terms "comprise", "include" or any variants thereof herein are intended to cover non-exclusive inclusion, such that a process, a method, an article or a device comprising a series of elements comprise not only those elements, but also other elements not listed explicitly, or elements inherent to this process, method, article or device. An element defined by a statement "comprising one . . . " without more limitations do not preclude the presence of another identical element in the process, method, article or device comprising this element.

The above descriptions are merely implementations of the present application, but the protection scope of the present application is not limited to these. Any variation or replacement readily figured out by those skilled in the art within the technical scope as disclosed by the present application shall fall within the protection scope of the present application. Therefore, the protection scope of the present application shall be subject to the protection scope of the claims.

What is claimed is:

1. A page buffer, comprising a plurality of latch circuits, a latch circuit of the plurality of latch circuits including:
   a resetting control circuit coupled to a first data node and configured to receive a first supply voltage to determine a potential of the first data node;
   a setting control circuit coupled to a second data node and configured to receive the first supply voltage to determine a potential of the second data node;

a data transmission circuit coupled to the first data node and the second data node and configured to receive a second supply voltage; and
   a latch transmission circuit coupled to the first data node, the second data node, and a sense node, wherein the first supply voltage is higher than the second supply voltage, wherein the latch transmission circuit includes a fifth transistor and a sixth transistor, and wherein:
      a control electrode of the fifth transistor is coupled with the first data node, a first electrode of the fifth transistor is coupled with the second data node, and a second electrode of the fifth transistor is coupled with a first electrode of the sixth transistor; and
      a control electrode of the sixth transistor receives a transmission signal, and a second electrode of the sixth transistor is coupled with the sense node.

2. The page buffer of claim 1, wherein the setting control circuit is configured to set the second data node and the first data node to a first logic level and a second logic level, respectively, in response to a setting signal being in an enabled state, wherein the first logic level is higher than the second logic level;
   the resetting control circuit is configured to set the first data node and the second data node to the first logic level and the second logic level, respectively, in response to a reset signal being in the enabled state; and
   the latch transmission circuit is configured to couple the second data node with the sense node in response to the transmission signal being in the enabled state and the first data node and the second data node being at the first logic level and the second logic level, respectively, wherein the sense node is at the second logic level.

3. The page buffer of claim 2, wherein the latch transmission circuit is further configured to, when the sense node is at the first logic level, maintain the sense node at the first logic level in response to the transmission signal being in the enabled state and the first data node and the second data node being at the second logic level and the first logic level, respectively.

4. The page buffer of claim 1, wherein the data transmission circuit includes a first transistor and a second transistor;
   a control electrode of the first transistor is coupled with the first data node, a first electrode of the first transistor is coupled with a second supply voltage node, and a second electrode of the first transistor is coupled with the second data node; and
   a control electrode of the second transistor is coupled with the second data node, a first electrode of the second transistor is coupled with the second supply voltage node, and a second electrode of the second transistor is coupled with the first data node.

5. The page buffer of claim 1, wherein:
   the resetting control circuit includes a third transistor, a control electrode of the third transistor receives a reset signal, a first electrode of the third transistor is coupled with a first supply voltage node, and a second electrode of the third transistor is coupled with the first data node; and
   the setting control circuit includes a fourth transistor, a control electrode of the fourth transistor receives a setting signal, a first electrode of the fourth transistor is coupled with the first supply voltage node, and a second electrode of the fourth transistor is coupled with the second data node.

6. The page buffer of claim 1, wherein the latch transmission circuit includes the fifth transistor and the sixth transistor in a serial cascade relationship, and the fifth transistor and the sixth transistor are N-type transistors.

7. The page buffer of claim 1, wherein the latch circuit further includes a voltage stabilizing circuit coupled with the first data node and the second data node and configured to stabilize a voltage difference between the first data node and the second data node.

8. The page buffer of claim 7, wherein the voltage stabilizing circuit includes a capacitor, wherein a first plate of the capacitor is coupled with the first data node, and a second plate of the capacitor is coupled with the second data node.

9. The page buffer of claim 7, wherein the voltage stabilizing circuit includes a seventh transistor, wherein a control electrode of the seventh transistor is coupled with the second data node, and a first electrode and a second electrode of the seventh transistor are both coupled with the first data node.

10. The page buffer of claim 1, further including:

a bit line control circuit coupled with a first supply voltage node, a bit line, and the sense node, and configured to control a potential level of the sense node during a sense operation based on a current level of the bit line; and a bit line discharge circuit coupled between the bit line and a second supply voltage node and configured to discharge a potential level of the bit line in response to a discharge control signal.

11. A memory device, comprising:

a memory cell array coupled with a plurality of bit lines; and a plurality of page buffers, a page buffer of the plurality of page buffers coupled with a bit line of the plurality of bit lines and configured to perform a sense operation based on a current level of the bit line, wherein the page buffer includes a plurality of latch circuits, a latch circuit of the plurality of latch circuits including:

a resetting control circuit coupled to a first data node and configured to receive a first supply voltage to determine a potential of the first data node;

a setting control circuit coupled to a second data node and configured to receive the first supply voltage to determine a potential of the second data node;

a data transmission circuit coupled to the first data node and the second data node and configured to receive a second supply voltage; and a latch transmission circuit coupled to the first data node, the second data node, and a sense node, wherein the first supply voltage is higher than the second supply voltage, wherein the latch transmission circuit includes a fifth transistor and a sixth transistor, and wherein:

a control electrode of the fifth transistor is coupled with the first data node, a first electrode of the fifth transistor is coupled with the second data node, and a second electrode of the fifth transistor is coupled with a first electrode of the sixth transistor; and a control electrode of the sixth transistor receives a transmission signal, and a second electrode of the sixth transistor is coupled with the sense node.

12. The memory device of claim 11, wherein the setting control circuit is configured to set the second data node and the first data node to a first logic level and a second logic level, respectively, in response to a setting signal being in an enabled state, wherein the first logic level is higher than the second logic level;

the resetting control circuit is configured to set the first data node and the second data node to the first logic level and the second logic level, respectively, in response to a reset signal being in the enabled state; and the latch transmission circuit is configured to couple the second data node with the sense node in response to the transmission signal being in the enabled state and the first data node and the second data node being at the first logic level and the second logic level, respectively, wherein the sense node is at the second logic level.

13. The memory device of claim 12, wherein the latch transmission circuit is further configured to, when the sense node is at the first logic level, maintain the sense node at the first logic level in response to the transmission signal being in the enabled state and the first data node and the second data node being at the second logic level and the first logic level, respectively.

14. The memory device of claim 11, wherein the data transmission circuit includes a first transistor and a second transistor;

a control electrode of the first transistor is coupled with the first data node, a first electrode of the first transistor is coupled with a second supply voltage node, and a second electrode of the first transistor is coupled with the second data node; and a control electrode of the second transistor is coupled with the second data node, a first electrode of the second transistor is coupled with the second supply voltage node, and a second electrode of the second transistor is coupled with the first data node.

15. The memory device of claim 11, wherein:

the resetting control circuit includes a third transistor, a control electrode of the third transistor receives a reset signal, a first electrode of the third transistor is coupled with a first supply voltage node, and a second electrode of the third transistor is coupled with the first data node; and the setting control circuit includes a fourth transistor, a control electrode of the fourth transistor receives a setting signal, a first electrode of the fourth transistor is coupled with the first supply voltage node, and a second electrode of the fourth transistor is coupled with the second data node.

16. The memory device of claim 11, wherein the latch transmission circuit includes the fifth transistor and the sixth transistor in a serial cascade relationship, and the fifth transistor and the sixth transistor are N-type transistors.

17. An operation method of a page buffer, wherein the page buffer comprises:

a plurality of latch circuits, a latch circuit of the plurality of latch circuits including a resetting control circuit coupled with a first data node, a setting control circuit coupled with a second data node, and a data transmission circuit coupled with both the first data node and the second data node;

a latch transmission circuit coupled with the first data node, the second data node, and a sense node, wherein the latch transmission circuit includes a fifth transistor and a sixth transistor, and wherein:

a control electrode of the fifth transistor is coupled with the first data node, a first electrode of the fifth transistor is coupled with the second data node, and a second electrode of the fifth transistor is coupled with a first electrode of the sixth transistor; and a control electrode of the sixth transistor receives a transmission signal, and a second electrode of the sixth transistor is coupled with the sense node; and the operation method includes:

in a reset phase, setting a reset signal to an enabled state, and setting, by the resetting control circuit, the first data node and the second data node to a first logic level and a second logic level, respectively, in response to the enabled state of the reset signal, wherein the first logic level is higher than the second logic level; and in a read phase, where the sense node is at the first logic level, following the reset phase, setting the transmission signal to the enabled state, and coupling, by the latch transmission circuit, the second data node with the sense node in response to the transmission signal being in the enabled state, so that wherein the sense node changes from the first logic level to the second logic level.

18. The operation method of the page buffer of claim 17, further including:

in a setting phase, setting a setting signal to the enabled state, and setting, by the setting control circuit, the first data node and the second data node to the second logic level and the first logic level, respectively, in response to the enabled state of the setting signal; and in the read phase, where the sense node is at the first logic level, following the setting phase, disconnecting, by the latch transmission circuit, the second data node from the sense node to maintain a level of the sense node at the first logic level.

19. The operation method of the page buffer of claim 17, further comprising, when the sense node is at the first logic level, maintaining the sense node at the first logic level in response to the transmission signal being in the enabled state and the first data node and the second data node being at the second logic level and the first logic level, respectively.

20. The operation method of the page buffer of claim 17, wherein the latch circuit further includes a voltage stabilizing circuit coupled with the first data node and the second data node and configured to stabilize a voltage difference between the first data node and the second data node.

* * * * *